United States Patent
Castro

(10) Patent No.: US 10,360,975 B2
(45) Date of Patent: *Jul. 23, 2019

(54) ACCESSING MEMORY CELLS IN PARALLEL IN A CROSS-POINT ARRAY

(71) Applicant: Micron Technology, Inc., Boise, ID (US)

(72) Inventor: Hernan A. Castro, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/858,801

(22) Filed: Dec. 29, 2017

(65) Prior Publication Data
US 2018/0190349 A1 Jul. 5, 2018

Related U.S. Application Data

(63) Continuation of application No. 15/645,130, filed on Jul. 10, 2017, now Pat. No. 9,934,850, which is a (Continued)

(51) Int. Cl.
*G11C 13/00* (2006.01)
*G06F 3/06* (2006.01)

(52) U.S. Cl.
CPC .......... *G11C 13/003* (2013.01); *G06F 3/061* (2013.01); *G06F 3/0658* (2013.01); (Continued)

(58) Field of Classification Search
CPC .............. G11C 13/003; G11C 13/0004; G11C 13/0023; G11C 13/004; G11C 13/0061; (Continued)

(56) References Cited

U.S. PATENT DOCUMENTS 6,385,075 B1  5/2002  Taussig et al.
6,768,685 B1  7/2004  Scheuerlein
(Continued)

FOREIGN PATENT DOCUMENTS

CN      1881469 A    12/2006
JP   2006323924 A    11/2006
(Continued)

OTHER PUBLICATIONS

Kau et al., "A stackable cross point phase change memory" Electron Devices Meeting (IEDM), Dec. 7-9, 2009, 4 pgs., 2009 IEEE International.
(Continued)

*Primary Examiner* — Fernando Hidalgo
(74) *Attorney, Agent, or Firm* — Holland & Hart LLP

(57) ABSTRACT

Methods and structures for accessing memory cells in parallel in a cross-point array include accessing in parallel a first memory cell disposed between a first selected column and a first selected row and a second memory cell disposed between a second selected column different from the first selected column and a second selected row different from the first selected row. Accessing in parallel includes simultaneously applying access biases between the first selected column and the first selected row and between the second selected column and the second selected row. The accessing in parallel is conducted while the cells are in a thresholded condition or while the cells are in a post-threshold recovery period.

16 Claims, 12 Drawing Sheets

Related U.S. Application Data continuation of application No. 15/061,838, filed on Mar. 4, 2016, now Pat. No. 9,741,432, which is a continuation of application No. 14/023,112, filed on Sep. 10, 2013, now Pat. No. 9,312,005.

(52) U.S. Cl.
CPC .......... *G06F 3/0673* (2013.01); *G11C 13/004* (2013.01); *G11C 13/0004* (2013.01); *G11C 13/0023* (2013.01); *G11C 13/0061* (2013.01); *G11C 13/0069* (2013.01); *G11C 13/0097* (2013.01); *G11C 2013/0088* (2013.01); *G11C 2213/15* (2013.01); *G11C 2213/71* (2013.01); *G11C 2213/77* (2013.01)

(58) Field of Classification Search
CPC ............ G11C 13/0069; G11C 13/0097; G11C 2013/0088; G11C 2213/15; G11C 2213/71; G11C 2213/77; G06F 3/061; G06F 3/0658; G06F 3/0673
USPC ....... 365/46, 55, 74, 97, 100, 131, 148, 158, 365/171, 173, 163
See application file for complete search history.

(56) References Cited

U.S. PATENT DOCUMENTS

| | | | |
|---|---|---|---|
| 7,085,190 B2 | 8/2006 | Worley et al. | |
| 7,099,180 B1 | 8/2006 | Dodge et al. | |
| 7,139,192 B1 | 11/2006 | Wong | |
| 7,280,390 B2 | 10/2007 | Kostylev et al. | |
| 7,382,664 B2 | 6/2008 | Phan | |
| 7,414,883 B2 | 8/2008 | Gordon et al. | |
| 7,483,296 B2 | 1/2009 | Bedeschi et al. | |
| 7,502,252 B2 | 3/2009 | Fuji et al. | |
| 7,672,155 B2 | 3/2010 | Kim et al. | |
| 7,701,791 B2* | 4/2010 | Rinerson | G11C 7/12 365/148 |
| 7,859,896 B2 | 12/2010 | Kurotsuchi | |
| 7,885,121 B2 | 2/2011 | Takase | |
| 7,911,823 B2 | 3/2011 | Futatsuyama et al. | |
| 7,978,508 B2 | 7/2011 | Czubatyj | |
| 8,144,494 B2 | 3/2012 | Takase | |
| 8,144,506 B2 | 3/2012 | Wells et al. | |
| 8,194,433 B2 | 6/2012 | Parkinson | |
| 8,208,285 B2 | 6/2012 | Khoury et al. | |
| 8,243,505 B2 | 8/2012 | Kang et al. | |
| 8,374,022 B2 | 2/2013 | Langtry et al. | |
| 8,385,111 B2 | 2/2013 | Kim | |
| 8,400,815 B2 | 3/2013 | Terada | |
| 8,467,253 B2 | 6/2013 | Perner | |
| 8,576,609 B2 | 11/2013 | Scheuerlein | |
| 8,605,495 B2 | 12/2013 | Lung | |
| 8,673,733 B2 | 3/2014 | Sadaka et al. | |
| 8,681,540 B2 | 3/2014 | Zeng | |
| 8,716,780 B2 | 5/2014 | Kellam et al. | |
| 8,765,581 B2 | 7/2014 | Lee et al. | |
| 8,817,533 B2 | 8/2014 | Gopalakrishnan | |
| 8,830,740 B2 | 9/2014 | Sasago et al. | |
| 8,927,955 B2 | 1/2015 | Sonehara et al. | |
| 8,937,292 B2 | 1/2015 | Bateman | |
| 8,953,363 B2 | 2/2015 | Shimakawa et al. | |
| 8,953,387 B2 | 2/2015 | Castro | |
| 9,117,515 B2 | 8/2015 | Lee et al. | |
| 9,306,549 B2 | 4/2016 | Chevallier et al. | |
| 9,324,423 B2 | 4/2016 | Castro | |
| 9,419,217 B2* | 8/2016 | Vereen | H01L 45/08 |
| 2007/0285966 A1 | 12/2007 | Toda et al. | |
| 2010/0284213 A1 | 11/2010 | Savransky | |
| 2010/0321988 A1* | 12/2010 | Wells | G11C 5/02 365/163 |
| 2011/0205789 A1 | 8/2011 | Kim | |
| 2012/0002461 A1 | 1/2012 | Karpov et al. | |
| 2012/0179927 A1* | 7/2012 | Sodhi | G06F 1/3206 713/323 |
| 2012/0250403 A1* | 10/2012 | Wang | G11C 11/5678 365/163 |
| 2012/0287706 A1 | 11/2012 | Lung | |

FOREIGN PATENT DOCUMENTS

| | | |
|---|---|---|
| WO | WO 2009158673 | 12/2009 |
| WO | WO 2015038328 | 3/2015 |

OTHER PUBLICATIONS

Ielmini et al., "Recovery and Drift Dynamics of Resistance and Threshold Voltages in Phase-Change Memories," IEEE Transactions on Electron Devices, Apr. 17, 2007, pp. 308-315, vol. 54, No. 2, Feb. 2007, IEEE.

ISA/KR, International Search Report of the International Searching Authority, Int'l. Appl. No. PCT/US2015/029106, Aug. 6, 2015, Korean Intellectual Property Office, Seo-gu, Daejeon, Republic of Korea, 3 pgs.

ISA/KR International Search Report of the International Searching Authority, Int'l. Appl. No. PCT/US2014/052763, Dec. 3, 2014, Korean Intellectual Property Office, Seo-gu, Daejeon, Republic of Korea, 12 pgs.

Kostylev, "Recovery and other effects of annihilation of high current density filaments after switching in chalcogenide alloys," Non-Volatile Memory Technology Symposium, 2008, Nov. 11-14, 2008, 7 pgs. 2008 IEEE.

English Translation of Chinese Office Action for Application No. CN201810798094.X, dated Apr. 11, 2019, 6 pgs.

\* cited by examiner

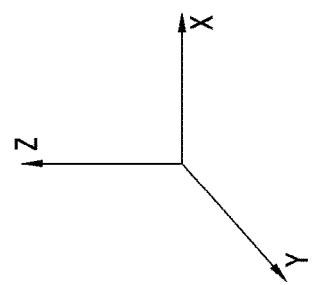
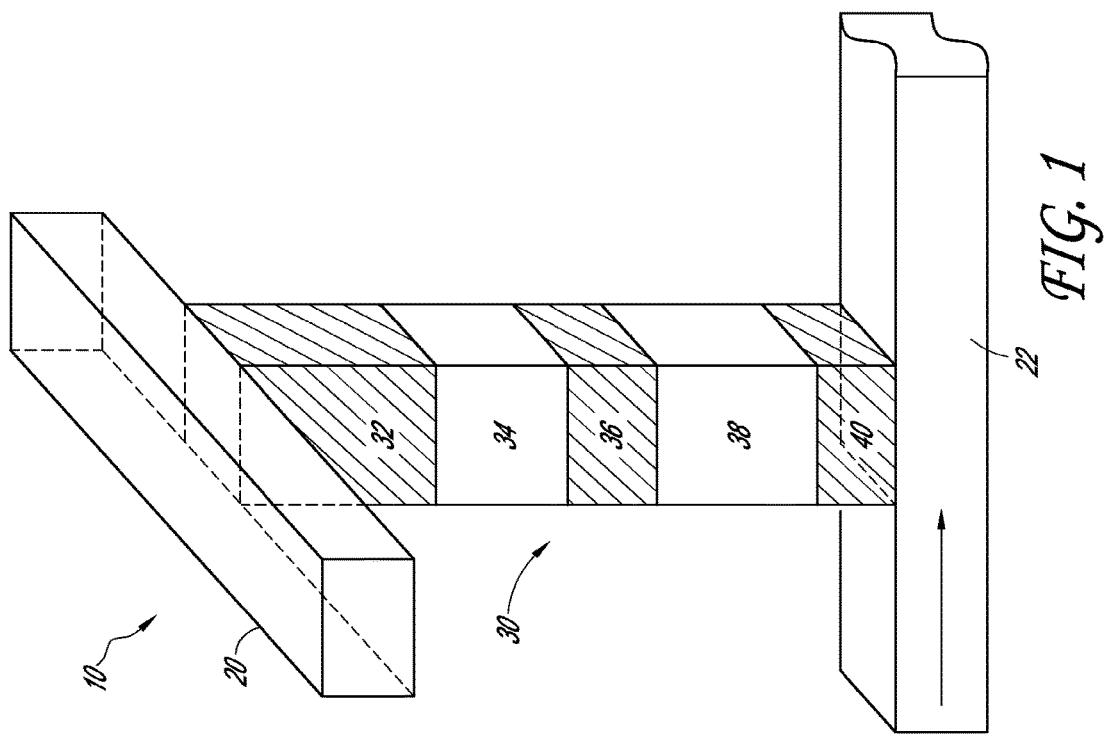

//ACCESSING MEMORY CELLS IN PARALLEL IN A CROSS-POINT ARRAY

CROSS REFERENCES

The present Application for Patent is a continuation of U.S. patent application Ser. No. 15/645,130 by Castro, entitled "Accessing Memory Cells in Parallel in a Cross-Point Array," filed Jul. 10, 2017, now U.S. Pat. No. 9,934,850, issued Apr. 3, 2018, which is a continuation of U.S. patent application Ser. No. 15/061,838 by Castro, entitled "Accessing Memory Cells in Parallel in a Cross-Point Array," filed Mar. 4, 2016, now U.S. Pat. No. 9,741,432, issued Aug. 22, 2017, which is a continuation of U.S. patent application Ser. No. 14/023,112 by Castro, entitled "Accessing Memory Cells in Parallel in a Cross-Point Array," filed Sep. 10, 2013, now U.S. Pat. No. 9,312,005, issued Apr. 12, 2016, assigned to the assignee hereof, and each of which is expressly incorporated by reference herein.

BACKGROUND

Field

Subject matter disclosed herein relates to devices in integrated circuits generally, and in particular, to methods of simultaneously accessing multiple cells within a cross-point array.

Description of the Related Art

Devices incorporating chalcogenide materials, e.g., ovonic threshold switches and phase change storage elements, may be found in a wide range of electronic devices. Such devices may be used in computers, digital cameras, cellular telephones, personal digital assistants, etc. Factors that a system designer may consider in determining whether and how to incorporate chalcogenide materials for a particular application may include, physical size, storage density, scalability, operating voltages and currents, read/write speed, read/write throughput, transmission rate, and/or power consumption, for example.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 1 is a schematic three-dimensional isometric view depicting a memory cell incorporating chalcogenide materials according to one embodiment.

DETAILED DESCRIPTION OF EMBODIMENTS

Figure 2:
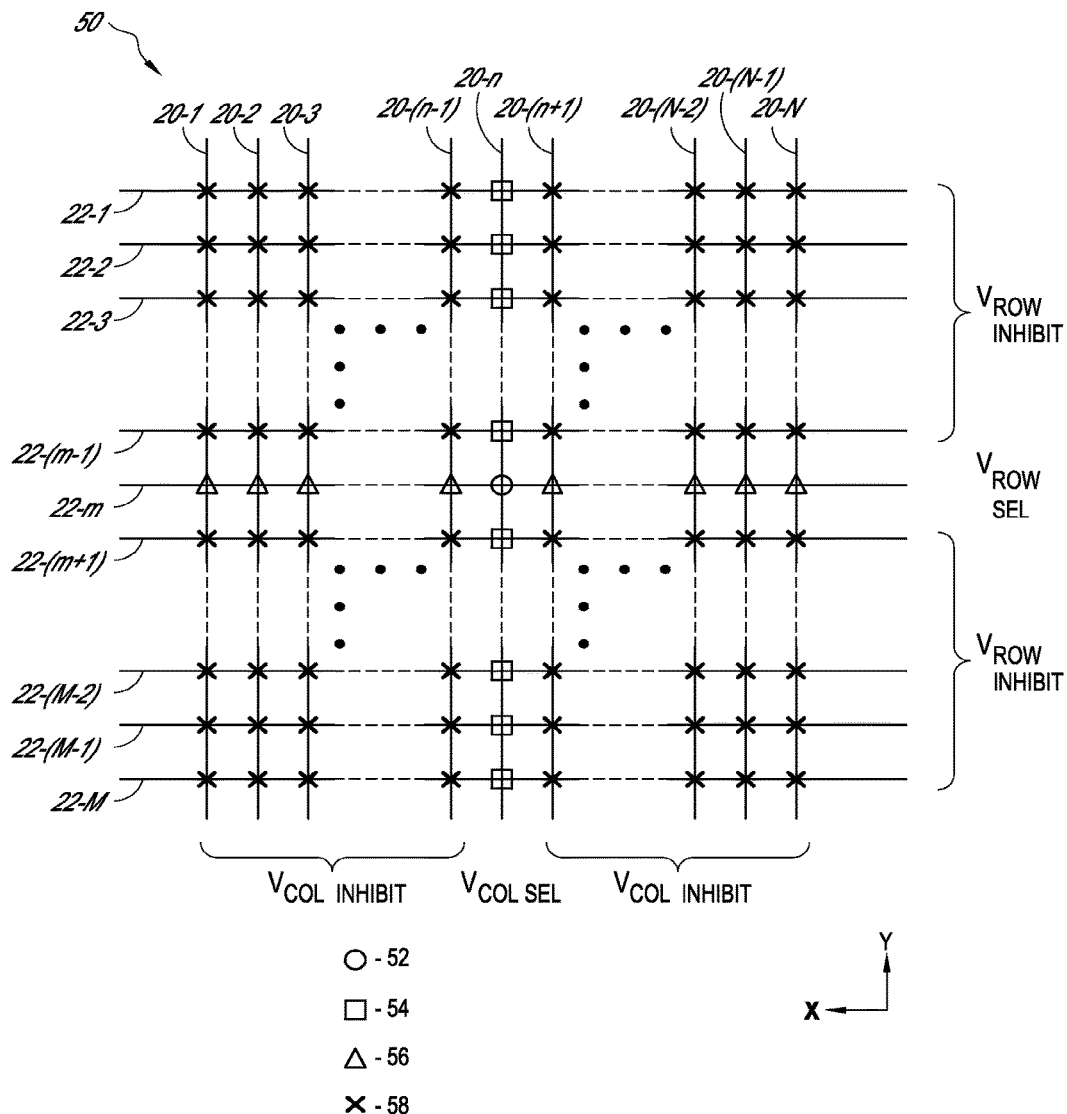
FIG. 2 is a schematic plan-view illustration depicting a cross-point memory array according one embodiment.

Devices incorporating materials that change resistance in operation may be found in a wide range of electronic devices, for e.g., computers, digital cameras, cellular telephones, personal digital assistants, etc. Devices incorporating such materials, for example, can be memory devices. Chalcogenide materials, for example, can have their resistance changed by application of heat, either from an adjacent heater or joule heating of the material itself. Some memory devices incorporating chalcogenide materials can be phase change memory devices that store information based on the resistance change originating from a stable change in phase of the chalcogenide materials. Phase change memory devices can provide several performance advantages over other memory devices, such as flash memory devices and dynamic random access memory devices (DRAM). For example, some phase change memory devices can be non-volatile; i.e., physical and electrical states of the memory devices do not change substantially over a retention time (e.g., longer than one year) without any external power supplied thereto. In addition, some phase change memory devices can provide fast read and write access time (e.g., faster than 10 nanoseconds) and/or high read and write access bandwidth (e.g., greater than 100 megabits per second). In addition, some phase change memory device can be arranged in a very high density memory array, e.g., a cross-point array having greater than 1 million cells in the smallest memory array unit connected with local metallization. Chalcogenide materials can also be employed in ovonic threshold switch (OTS) devices that can also be used in memory arrays, and in particular in phase change memory cells as selector elements in series with phase change storage elements.

Performance of a phase change memory device with respect to a particular type of memory access operation (e.g., write, erase, read) depends on many factors. For phase change memory cells that are threshold-switched (explained more in detail below), one factor that influences all types of access bandwidths (e.g., write access bandwidth, erase access bandwidth, or read bandwidth) can be the time it takes to threshold a phase change memory device. To perform various access operations in threshold-switched phase change memory cells, the memory cell is first be thresholded; i.e., the cell is placed in a low impedance state to that allows sufficient current to pass through the memory cell to enable the various access operations including write, erase, or read. The thresholding event itself may be relatively short compared to the overall access times. The time it takes to threshold the phase change memory cell can in turn depend on many factors, such as the composition of the chalcogenide material, the voltage applied on the cell, and the memory cell structure.

Accessing multiple memory cells, or bits, within a memory can increase the access bandwidth independent from the factors that determine the time it takes to threshold a memory cell. In general, due to the nature of the thresholding event and the nature of biasing schemes employed in a cross point array of threshold-switching phase change memory cells, access operations are performed on one cell at a time. For example, the amount of current available within an array design can make it impractical to access multiple cells in parallel. Thus, there is a need for a method of accessing a plurality of memory cells in a cross-point memory array in parallel. Methods taught herein simultaneously selects multiple cells within a cross point array of threshold-switching phase change memory cells such that write, erase, read operations can be carried out in parallel to increase access bandwidths.

While embodiments are described herein with respect to cross-point memory arrays, simultaneously accessing multiple devices as described herein can also have application outside the memory array context, e.g., switches, antifuses, etc. Similarly, while embodiments are described with respect to memory cells incorporating OTS and/or memory storage elements that incorporate chalcogenide materials, the principles and advantages of the techniques and structures taught herein may be useful for other materials that demonstrate thresholding behavior.

FIG. 1 depicts a memory cell 10 in a cross-point memory array according to one embodiment. The memory cell 10 in FIG. 1 is a phase change memory cell arranged in a stack configuration between a column line 20 extending in a y direction and a row line 22 extending in an x direction. The cell includes a first electrode 32 in electrical communication with the column line 20, a selector node 34 in electrical communication under the first electrode 32, a middle electrode 36 in electrical communication under the selector node 34, a storage node 38 in electrical communication under the middle electrode 36, and a second electrode 40 in electrical communication between the storage node 38 the a row line 22. Other embodiments of a stack configuration are possible. For example, the positions of the storage node 38 and the selector node 34 within a stack configuration may be interchanged with one another. In other examples, any one of the first, second, and middle electrodes may be interchanged with one another. In yet other examples, any one of the first electrode 32, the middle electrode 36, the second electrode 40, and the selector node 38 may be omitted. Additionally, the "row" and "column" designations are interchangeable, and the rows and columns are generally perpendicular but may intersect at other than 90°.

In one embodiment, one or both of the storage node 38 and the selector node 34 can comprise chalcogenide materials. When both the storage node 38 and the selector node 34 comprise chalcogenide materials, the storage node 38 can comprise a chalcogenide material that can undergo a phase change that is nonvolatile at room temperature. On the other hand, the selector node 34 can comprise a chalcogenide material that does not undergo a similar stable phase change.

In one embodiment, the storage node 38 includes a phase change material that includes chalcogenide compositions such as an alloy including at least two of the elements within the indium (In)-antimony (Sb)-tellurium (Te) (IST) alloy system, e.g., $In_2Sb_2Te_5$, $In_1Sb_2Te_4$, $In_1Sb_4Te_7$, etc., an alloy including at least two of the elements within the germanium (Ge)-antimony (Sb)-tellurium (Te) (GST) alloy system, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other chalcogenide alloy systems. The hyphenated chemical composition notation, as used herein, indicates the elements included in a particular mixture or compound, and is intended to represent all stoichiometries involving the indicated elements. Other chalcogenide alloy systems that can be used in phase change storage nodes include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

When included in the memory cell 10, the selector node 34 may be a two-terminal selector electrically coupled to the storage node 38 through the middle electrode 36 on one side and electrically connected to the column line 20 through the first electrode 32 on the other side. In one embodiment, the selector node 34 comprising a chalcogenide material and can be referred to as an Ovonic Threshold Switch (OTS). An OTS may include a chalcogenide composition including any one of the chalcogenide alloy systems described above for the storage node. In addition, the selector node may further comprise an element to suppress crystallization, such as arsenic (As). When added, an element such as As suppresses crystallization by inhibiting any non-transitory nucleation and/or growth of the alloy. Accordingly, the selector node 34 may be configured to switch to a conductive state when a potential exceeding a threshold voltage is applied across the selector node 34. In addition, the conductive state can be maintained while a sufficient holding current is maintained across the selector node. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

FIG. 2 illustrates a cross-point memory array 50 comprising N×M memory cells at intersections of N columns 20 extending in a y direction and M rows 22 extending in a x-direction according to one embodiment. N columns 20 including first through Nth columns 20-1, 20-2, . . . , and 20-N can be access lines, e.g., digit or bit lines, and M rows 22 including first through Mth rows 22-1, 22-2, . . . , and 22-M can be access lines, e.g., word lines that cross with the columns 22. The memory cells can be phase change memory cells disposed at at least a subset of the intersections formed by columns 20 and rows 22.

In one embodiment, any one of the memory cells disposed at an intersection formed by any one of columns 20 and rows 22 may have a resistance state that may be a relatively high resistance state (HRS), also known as the RESET state, which can correspond to a phase change material including a substantial amorphous region. Similarly, any one of the memory cells may have a resistance state that may be a relatively low resistance state (LRS), also known as the SET state, which can correspond to a phase change material that is substantially crystalline. The HRS and LRS can have a resistance ratio between, for example, two and 1 million. Under this implementation, low and high resistance states may correspond to the "1" state and a "0" state in a single bit-per-cell memory system. However, the states "1" and "0" as they relate to high and low resistance states may be used interchangeably to mean the opposite.

In other embodiments, any one of the memory cells disposed at an intersection formed by any one of the columns and rows may have a resistance state that may be an intermediate resistance state. For example, any one of the memory cells may have a resistance state that is any one of first, second, third, and fourth resistance states, wherein the first resistance state is more resistive than the second resistance state, the second resistive state is more resistive than the third resistive state, and the third restive state is more resistive than the fourth state. Under this implementation, first, second, third, and fourth resistance states may correspond to the "00," "01," "10", and "00" states in a two bits-per-cell memory system. Yet other embodiments are possible, where first through eighth resistance states represent the states in a three-bits-per cell memory system, and where first through sixteenth resistance states represent the states in a four-bits-per cell memory system.

In one embodiment, each one of the memory cells disposed at an intersection formed by any one of columns 20 and any one of rows 22 may be accessed by an access operation. As used herein, an access operation may refer to a write access operation, an erase access operation, or a read access operation. A write access operation, which for a phase change memory can also be referred to as a program operation or a RESET operation, changes the resistance state of the memory cell from a relatively low resistance state to a relatively high resistance state. Similarly, an erase operation, which for a phase change memory can also be referred to as a SET operation, changes the resistance state of the memory cell from a relatively high resistance state to a relatively low resistance state. However, the terms "write" and "erase" as they relate to RESET and SET operations may be used interchangeably to mean the opposite. For example, an erase operation may be referred to as a RESET operation, and a program or write operation may be referred to as a SET operation.

In the illustrated embodiment of FIG. 2, each one of the memory cells disposed at an intersection formed by any of the columns and rows may be biased individually in a bit-addressable access mode. As used herein, a bias applied to a memory cell refers to a voltage difference applied across the memory cell. In a bit-addressable bias mode, a memory cell to be accessed may be referred to as a target cell 52 located at an intersection formed by an nth column 20-$n$ and an mth row 22-$m$. An access bias may be a voltage-controlled bias $V_{ACCESS}$, which may be a SET access bias $V_{SET}$, a RESET access bias $V_{RESET}$, or a read access bias $V_{READ}$, which may be applied across the target cell of this example by applying the access voltages across the nth column 20-$n$ and the mth row 22-$m$. In other examples, an access bias may be a current-controlled bias $I_{ACCESS}$, which may be a SET access current $I_{SET}$, a RESET access current $I_{RESET}$, or a read access current $I_{READ}$.

In one embodiment, the target cell 52 can be accessed while inhibiting (i.e., preventing) the remaining cells from getting accessed. This can be achieved, for example, by applying bias of $V_{ACCESS}$ across the target cell 52 while applying biases substantially lower than $V_{ACCESS}$ across the rest of the cells. For example, $V_{COL\ SEL}$ can be applied to a selected column (20-$n$ in this example) while applying $V_{ROW\ SEL}$ to a selected row (22-$m$ in this example). Concurrently, a bias $V_{COL\ INHIBIT}$ is applied across all remaining columns and a bias $V_{ROW\ INHIBIT}$ is applied across all remaining rows. Under this configuration, when the bias between $V_{COL\ SEL}$ and $V_{ROW\ SEL}$ exceeds $V_{ACCESS}$, the target cell 52 can be accessed. In addition, a bias in magnitude of about ($V_{COL\ SEL}$-$V_{ROW\ INHIBIT}$) is dropped across inhibited cells 54 along the selected column 20-$n$. Hereinafter, the target cell 52 along the selected column and row, represented as a circle in FIG. 2, may be referred to as "T" cells. Hereinafter, inhibited cells 54 along the selected column, represented as squares in FIG. 2, may be referred to as "A" cells. In addition, a bias in magnitude of about ($V_{ROW\ SEL}$-$V_{COL\ INHIBIT}$) is dropped across inhibited cells 56 along the selected row 22-$m$. Hereinafter, inhibited cells 56 along the selected row, represented as triangles in FIG. 2, may be referred to as "B" cells. In addition, a bias in magnitude of about ($V_{COL\ INHIBIT}$-$V_{ROW\ INHIBIT}$) is dropped across all remaining inhibited cells 58 across inhibited rows and inhibited columns. Hereinafter, inhibited cells 58 across inhibited columns and inhibited rows, represented as X's in FIG. 2, may be referred to as "C" cells.

In some embodiments, an access operation on a memory cell comprising a chalcogenide material can be described as including multiple events, including a thresholding event. When a bias is applied across a memory cell for a certain period of time, the memory cell comprising the chalcogenide material can undergo a thresholding event, characterized by a rapid increase in the amount of current flow through the memory cell and a "snap back" event, characterized by a rapid reduction in the bias across the memory cell, discussed below in more detail in connection with FIG. 3. The thresholding event can occur in the storage node, the selector node, or both. Once thresholded, the memory cell conducts a relatively large amount of current (e.g., greater than 0.1 □A).

An access operation on a memory cell comprising a chalcogenide material can further include a phase change event. For a SET access, the phase change event can be an amorphous-to-crystalline transition which can occur in the storage node as a result of a SET current $I_{SET}$ flowing through the thresholded memory cell (or through an adjacent heater) that is sufficient to induce the amorphous-to-crystalline transition. The resulting change in the resistance of the chalcogenide material can be from a FIRS to a LRS.

On the other hand, for a RESET access, the phase change event can be a crystalline-to-amorphous transition which can occur in the storage node as a result of a RESET current $I_{RESET}$ flowing through the thresholded memory cell (or through an adjacent heater) that is sufficient to induce the crystalline-to-amorphous transition. The resulting change in the resistance of the chalcogenide material can be from an LRS to a HRS.

Under some circumstances, the current flowing through the thresholded memory cell or the duration of current flow is insufficient to induce either a SET or a HRS. In some embodiments, a READ access can be performed under these circumstances.

Figure 3:
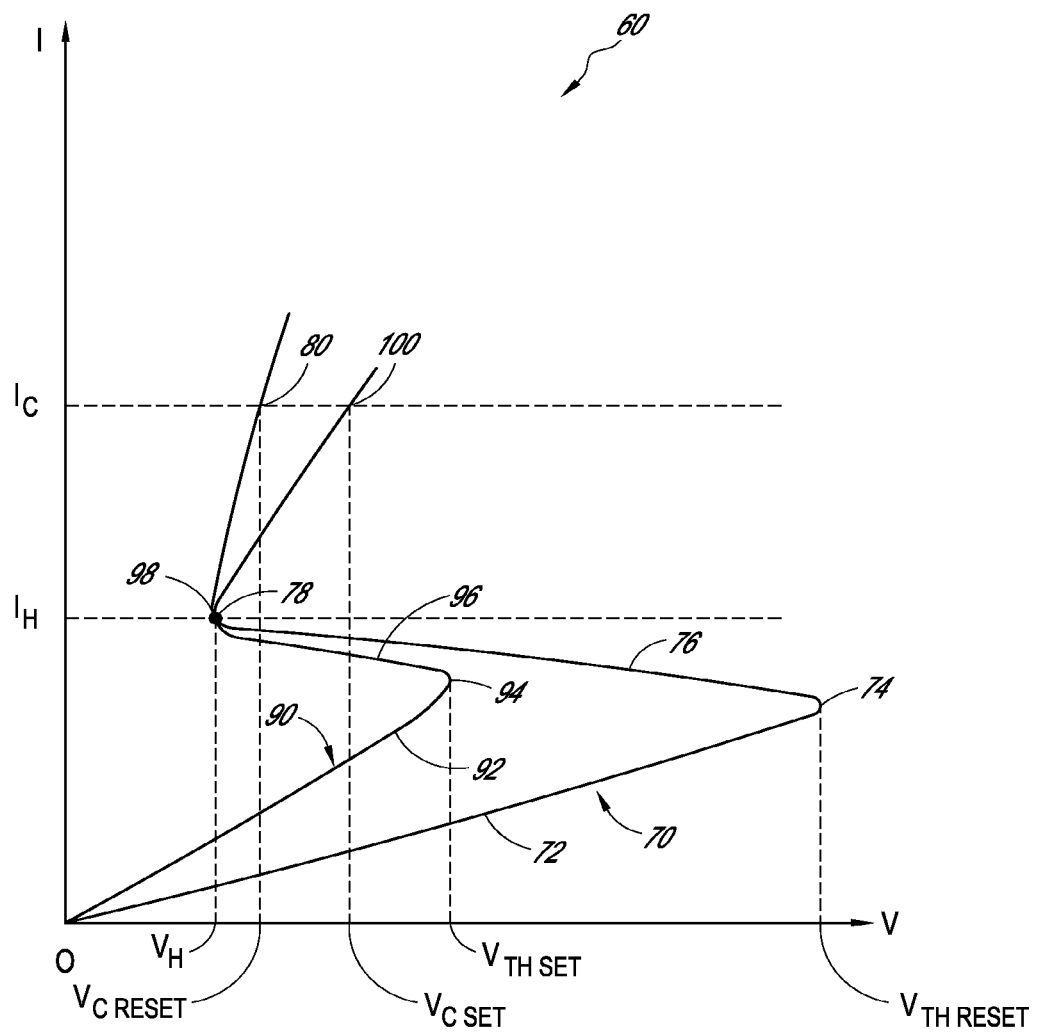
FIG. 3 is a graph of current versus voltage for a memory cell incorporating phase change materials according to one embodiment.

FIG. 3 schematically illustrates a graph 60 illustrating current-voltage (I-V) curves of a memory cell incorporating a chalcogenide material undergoing access operations according to one embodiment. The graph 60 illustrates an HRS I-V curve 70 of a phase change memory cell undergoing a RESET access operation and an LRS I-V curve 90 of a phase change memory cell undergoing a SET access operation. The voltage drop across the memory cell in the HRS I-V curve 70 and the LRS I-V curve 90 can represent combined voltage drops across the storage node in the FIRS state and the selector node, and across the storage node in the LRS state and the selector node, respectively. In the graph 60, the x-axis represents a bias applied across a phase change memory cell disposed between first and second electrodes and the y-axis represents the current measured in log scale across the phase change memory cell.

Referring to the HRS I-V curve 70, under a low voltage biasing condition between about zero volts and HRS state threshold voltage $V_{TH\ RESET}$, the portion of the HRS I-V curve 70 of the memory cell in the HRS includes a HRS subthreshold region 72 characterized by a relatively slow-varying current versus voltage. The HRS subthreshold region 72 is followed by a HRS threshold "nose" region 74. At the peak of the "nose," the HRS I-V curve 70 undergoes a rapid reversal of slope of the HRS I-V curve. The HRS threshold region 74 is followed by a HRS snap back region 76 characterized by a rapid reduction in the bias across the memory cell, and the slope of the HRS I-V curve 70 has a negative value (i.e., the differential resistance is negative). The HRS snap back region 76 is followed by a HRS hold region 78 at a voltage of about $V_H$. The HRS hold region 78 is followed by a HRS cell access region 80 at a voltage of about $V_{C\ RESET}$ Between the HRS hold region 78 and the HRS cell access region 80, the HRS I-V curve 70 has a very steep positive slope, which can exceed several decades of change in current over a fraction of a volt.

Referring to the LRS I-V curve 90, under a low voltage biasing condition between about zero volts and LRS state threshold voltage $V_{TH\ SET}$, the portion of the LRS I-V curve 90 of the memory cell in the LRS includes a LRS subthreshold region 92 characterized by a relatively slow-varying current versus voltage. The LRS subthreshold region 92 is followed by an LRS threshold "nose" region 94. At the peak of the "nose," the LRS I-V curve 90 undergoes a rapid reversal of slope of the LRS I-V curve. The LRS threshold region 94 is followed by a LRS snap back region 96 characterized by a rapid reduction in the bias across the memory cell, and the slope of the LRS I-V curve 90 has a negative value (i.e., the differential resistance is negative). The LRS snap back region 96 is followed by a LRS hold region 98 at a voltage of about $V_H$. The LRS hold region 98 is followed by a LRS cell access region 100 at a voltage of about $V_{C\ SET}$ Between the LRS hold region 98 and the LRS cell access region 100, the LRS I-V curve 90 has a very steep positive slope, which can exceed several decades of change in current over a fraction of a volt.

In FIG. 3, HRS and LRS hold regions 78 and 98 are regions of the HRS and LRS I-V curves 70 and 90 characterized by a hold voltage $V_H$ and a hold current $I_H$. In some embodiments, the phase change memory cell remains in the post snap-back high conductive state (e.g., $I_H$ about 100 nA or greater), so long as the current flowing across the phase change memory cell does not fall substantially below $I_H$. In addition, in some embodiments, the HRS and LRS cell access regions 80 and 100 may have substantially similar I-V characteristics, such that each has similar steep positive slopes.

In some embodiments, once a phase change memory cell has been "captured" by thresholding at a threshold voltage $V_{TH}$ and subsequently "released" by allowing the voltage and/or current to falls below $V_H$ and/or $I_H$, the phase change memory cell returns to a non-conducting state. However, the $V_{TH}$ of the phase change memory cell does not return to its initial value immediately. Instead, the $V_{TH}$ returns to its initial value over time, for example logarithmically over time. This aspect of the phase change memory can provide an advantage in subsequently accessing multiple cells in parallel by "capturing and releasing," as will be discussed in connection with FIGS. 6 to 8.

In addition, in FIG. 3, according to one embodiment, the HRS cell access region 80 of the HRS I-V curve 70 can represent a condition in which the current flowing through the phase change memory cell is sufficient to induce an amorphous-to-crystalline SET transition in the storage node of the phase change memory cell. On the other hand, the LRS cell access region 100 of the LRS I-V curve 90 can represent a condition in which the current flowing through the phase change memory cell is sufficient to induce a crystalline-to-amorphous RESET transition in the storage node of the phase change memory cell. Although not depicted in FIG. 3, in addition to the amount of current flowing through the phase change memory cell, SET and RESET transitions may be carried out at a characteristic transition rate to achieve the desired HRS or LRS states. For example, to achieve an HRS state, a relatively sharp transition from a high current to a low current may be employed whereas to achieve a LRS state, a relatively slow transition from high current to low current may be implemented. For clarity of presentation, however, the transition rates are not illustrated in the subsequent descriptions. In addition, the portion of the LRS I-V curve 90 between $V_H$ and $V_C$ SET and between $I_H$ and $I_C$ can represent a condition in which the current flowing through the phase change memory cell is sufficient to detect a read signal but insufficient to induce a RESET transition in the storage node of the phase change memory cell.

In each of the SET access, the RESET access, and the READ access operations of the memory cell, because the y axis is in log scale, it will be appreciated that once a cell is thresholded and a current greater than at least $I_H$ flows across the cell, a ratio of the current flowing across the thresholded cell and the current flowing across a non-thresholded cell can exceed several orders (e.g., 3 orders or higher) of magnitude, and the techniques employed below can take advantage of this condition. This high current ratio can provide lower overall current in the subsequent access operations, which can be utilized in subsequently accessing multiple cells in parallel by "capturing and holding," as will be discussed in connection with FIGS. 6 to 8.

Figure 4:
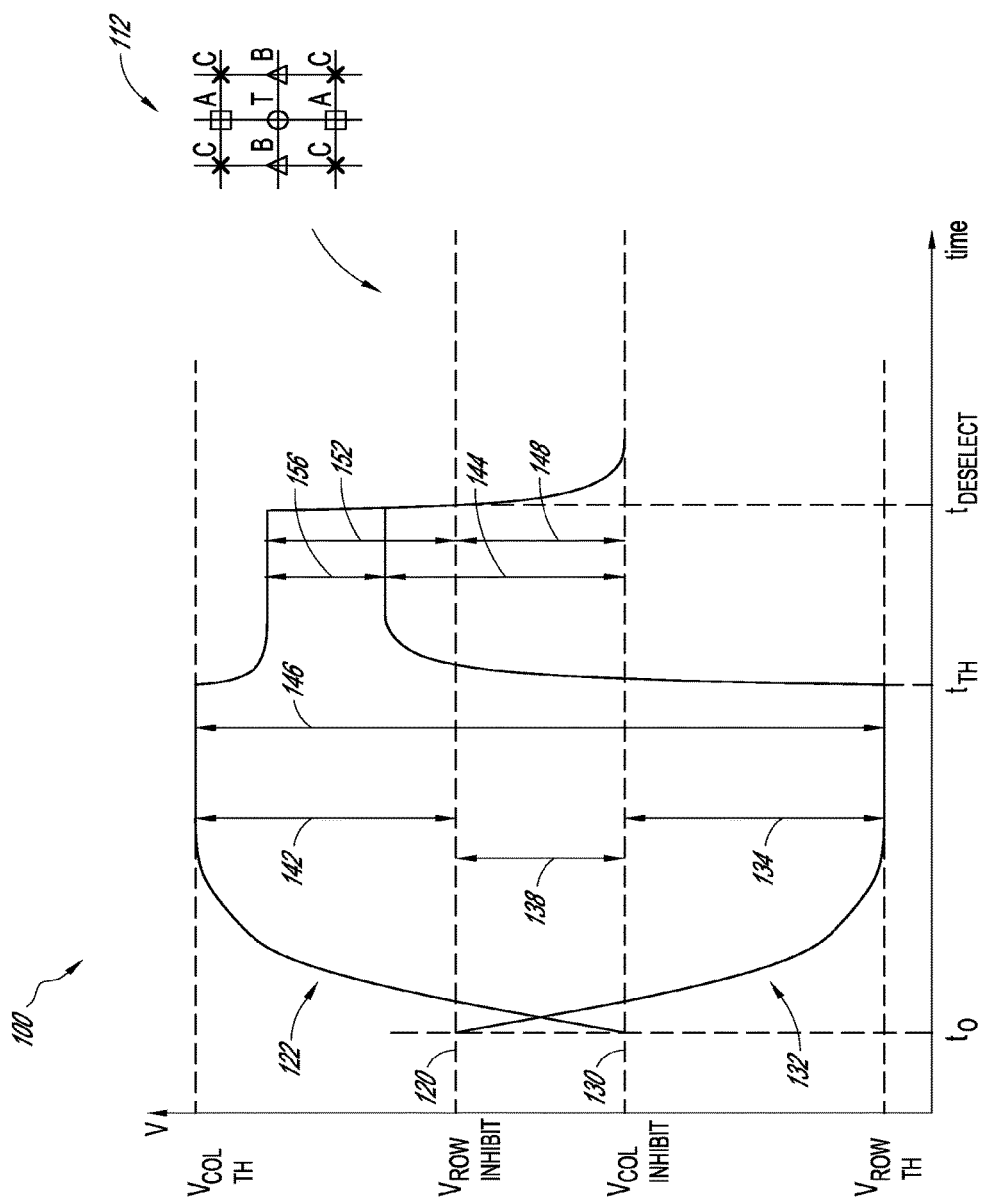
FIG. 4 is a graphical illustration of voltage versus time evolution for a memory cell incorporating chalcogenide materials being accessed according to one embodiment.

FIG. 4 illustrates a graph 110 schematically depicting voltage-time curves of columns and rows of a cross-point array as a memory cell is accessed, according to one embodiment. The illustrated embodiment represents a SET access including a thresholding event and an amorphous-to-crystalline transition event. However, in view of the disclosure herein, it will be understood that the concepts described are generally applicable to RESET access operations as well as READ access operations. The y-axis represents the voltage of the columns or rows, and the x-axis represents time.

In FIG. 4, various cell configurations of the cross-point memory array are depicted in a cross-point array 112. For clarity, only three rows and columns are depicted in the cross-point array 112, in which a target T cell is represented as a circle, A cells (i.e., inhibited cells along the selected column) are represented as squares, B cells (i.e., inhibited cells along the selected row) are represented as triangles, and C cells (i.e., all remaining inhibited cells between inhibited rows and inhibited columns) are represented as X's.

In the illustrated embodiment in FIG. 4, all columns are initially (prior to selection) pre-charged to a column inhibit voltage level ($V_{COL\ INH}$) 130 and all rows are pre-charged to a row inhibit voltage level ($V_{ROW\ INH}$) 120 prior to thresholding the memory cell. Under this condition, all cells have a pre-selected bias represented by a C cell bias 138, which can have a magnitude of ($V_{COL\ INH}-V_{ROW\ INH}$). It will be appreciated that in some embodiments, the column inhibit voltage level ($V_{COL\ INH}$) 130 and the row inhibit voltage level ($V_{ROW\ INH}$) 120 can be substantially the same, such that the magnitude of ($V_{COL\ INH}-V_{ROW\ INH}$) is substantially zero.

Subsequently, at time t=t$_0$, voltage levels of a selected column and a selected row are increased in magnitude to voltage levels V$_{COL\ SEL}$ and V$_{ROW\ SEL}$, respectively, represented by selected column and selected row voltage-time (V-T) curves 122 and 132, respectively. Once the selected row and the selected column reaches threshold voltage levels V$_{COL\ TH}$ and V$_{ROW\ TH}$, respectively, the bias across a target cell (T) can be represented by a threshold T cell bias 146, which can have a magnitude of (V$_{COL\ TH}$−V$_{ROW\ TH}$). In addition, biases across A, B, and C cells can be represented by a pre-threshold A cell bias 142 which can have a magnitude (V$_{COL\ TH}$−V$_{ROW\ INH}$) in absolute value, a pre-threshold B cell bias 134 which can have a magnitude (V$_{ROW\ TH}$−V$_{COL\ INH}$) in absolute value, and the pre-threshold C cell bias 138, which can have a magnitude (V$_{COL\ INH}$−V$_{ROW\ INH}$) in absolute value, respectively.

When the T cell has been subject to the threshold T cell bias 146 for a certain duration of time, the T cell undergoes a thresholding event at t=t$_{TH}$ marked by a sudden drop in the bias across the T cell, which can cause the voltage of the selected row V-T curve 132 to rapidly increase in magnitude, and can rise above V$_{ROW\ INH}$. The thresholding event at t=t$_{TH}$ can also cause the voltage of the selected column V-T curve 122 to rapidly reduce in magnitude. As illustrated, the magnitude of the voltage increase of the selected row V-T curve 132 can be larger than the magnitude of a voltage reduction of the selected column V-T curve 122. In other embodiments, the magnitude of a voltage increase of the selected row can be smaller than the magnitude of a voltage reduction of the selected column.

As discussed above, once the thresholding event occurs at t=t$_{TH}$, the current flow through the memory cell can rapidly increase to provide sufficient current for an amorphous-to-crystalline transition. In some embodiments, the time period between t=t$_{DESELECT}$ and t=t$_{TH}$ can represent a time duration corresponding to an amorphous-to-crystalline transition event following the thresholding event of the memory cell undergoing the amorphous-to-crystalline phase transition. During the amorphous-to-crystalline transition event, the bias across the T cell is reduced to a post-threshold T cell bias 156. In addition, during the amorphous-to-crystalline transition event, biases across A, B, and C cells can be represented by a post-threshold A cell bias 152, a post-threshold B cell bias 144, and a post-threshold C cell bias 148 (unchanged from 138), respectively. In the illustrated embodiment, the post-threshold T cell bias 156 can be substantially lower than the post-threshold A cell bias 152, the post-threshold B cell bias 144, and the post-threshold C cell bias 148.

In some embodiments t=t$_{DESELECT}$ can represent the completion of the amorphous-to-crystalline transition, at which point all columns are returned to V$_{COL\ INH}$ and all rows are returned to V$_{ROW\ INH}$. At this point, biases across all cells, including the target cell T, returns to the C-cell bias 138.

Figure 5:
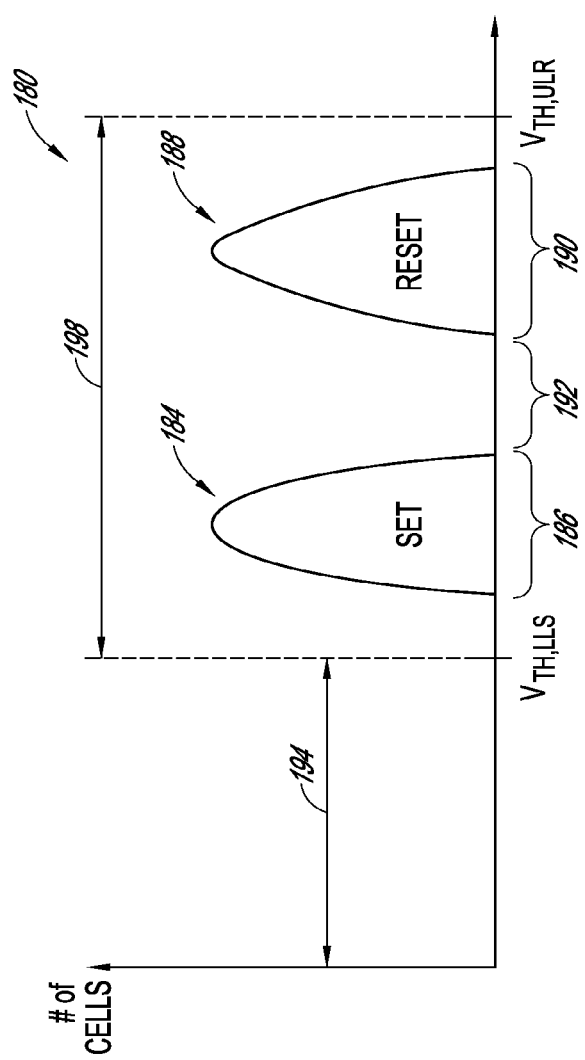
FIG. 5 is a threshold voltage distribution of phase memory cells according to one embodiment.

Because a memory array has numerous memory cells, the memory array can have a distribution of SET and RESET threshold voltages V$_{TH\ SET}$ and V$_{TH\ RESET}$. FIG. 5 is a schematic representation of a threshold voltage distributions plot 180. The x-axis of the threshold distributions plot 180 represents threshold voltages of memory cells within the memory array and the y-axis of the threshold distributions 180 represents the number of cells having the threshold voltages.

The threshold distributions plot 180 includes a RESET V$_{TH}$ distribution curve 188 representing a distribution of V$_{TH\ RESET}$ of memory cells in the cross-point memory array in the RESET state. The RESET V$_{TH}$ distribution curve 188 has a RESET V$_{TH}$ range 190, which can be a range defined by +/−n☐ of the memory cells within the RESET distribution, where ☐ is a standard deviation of RESET V$_{TH}$ distribution. Depending on the error tolerance of the memory array, n can have a value between, for example, 3 and 5, for instance 4. The threshold distributions plot 180 also includes a SET V$_{TH}$ distributions curve 184 representing a distribution of V$_{TH\ SET}$ of memory cells in the memory array are in SET states. The SET V$_{TH}$ 184 distribution curve has a SET V$_{TH}$ range 186, which can be a range defined by +/−n☐ of the memory cells within the SET distribution, where ☐ is a standard deviation of SET V$_{TH}$. Depending on the error tolerance of the cross-point memory array, n can have a value between, for example, 3 and 5, for instance 4.

In some embodiments, the SET V$_{TH}$ range 186 and the RESET V$_{TH}$ range 190 can represent a snapshot of V$_{TH}$ ranges in time, for example immediately after being programmed to the respective distributions. V$_{TH}$ of cells in both SET and RESET states can change over time because, under some circumstances, after being RESET or SET, the V$_{TH}$ of the memory cells can increase in value, or "drift" over time. Under other circumstances, the V$_{TH}$ of the cells can also decrease over time. To account for such changes in V$_{TH}$ over time, in some embodiments, a specification V$_{TH}$ range 198 can be defined by the lowest V$_{TH}$ value (lower limit of SET, or V$_{TH,\ LLS}$) a cell within the SET V$_{TH}$ distribution curve 184 is allowed to have and the highest V$_{TH}$ value (upper limit of RESET V$_{TH}$, or V$_{TH,ULR}$) a cell within the RESET V$_{TH}$ distribution curve 190 is allowed to have. In some embodiments, the V$_{TH}$ value range bounded by V$_{TH,LLS}$ and V$_{TH,ULR}$ can be wider than the lowest SET V$_{TH}$ value within the SET V$_{TH}$ range 186 and the highest RESET V$_{TH}$ value within the RESET V$_{TH}$ range 190.

During an access operation, at a given moment in time, a memory cell can have one of V$_{TH}$ values within the specification range 198. In some embodiments, inhibited cells including A cells, B cells, and C cells can be configured to receive inhibit biases represented by an inhibit bias range 194, whose highest value does not exceed V$_{TH,LLS}$. In this way, inhibited cells are not unintentionally switched.

As discussed above in connection with FIG. 3, after a memory cell has been "captured" by applying a bias exceeding a SET V$_{TH}$ or a RESET V$_{TH}$, the bias across the target cell reduces to a "hold" voltage value V$_H$, at which voltage a current value of about I$_H$ passes through the memory cell. Upon "releasing" the target cell by allowing the bias across and/or current through the memory cell to fall below about V$_H$ and/or I$_H$, the V$_{TH}$ of the memory cell "recovers" the V$_{TH}$ value the memory cell had prior to the "snap back" over a characteristic time period. That is, a permanent phase transition does not occur during the recovery of the V$_{TH}$. In some embodiments, the V$_{TH}$ can recover logarithmically over time. For example, a memory cell may recover 50% of its pre-snap back V$_{TH}$ within a recovery time period that can last between about 10 nanoseconds sec and about 50 nanoseconds. During the recovery period, V$_{TH}$ of a memory cell can have a value between the pre-snap back V$_{TH}$ value and V$_H$. In one embodiment, which may be referred to herein as "capture and release method," the temporarily lowered V$_{TH}$ of a "released" memory cell can be utilized to access the memory cells in parallel (SET, RESET, or READ). In another embodiment, which may be referred to herein as "capture and hold method," the temporarily lowered post-threshold target cell bias of a "held" memory cell can be utilized to access the memory cells in parallel (SET, RESET, or READ). With reference to FIG. 5, in these embodiments, when the access bias is less than the $V_{TH,LLS}$, the thresholded memory cells can be accessed in parallel without unintentionally thresholding inhibited memory cells. In the following, with reference to FIGS. 6-8, embodiments of accessing memory cells within a cross-point array are disclosed.

Figure 6:
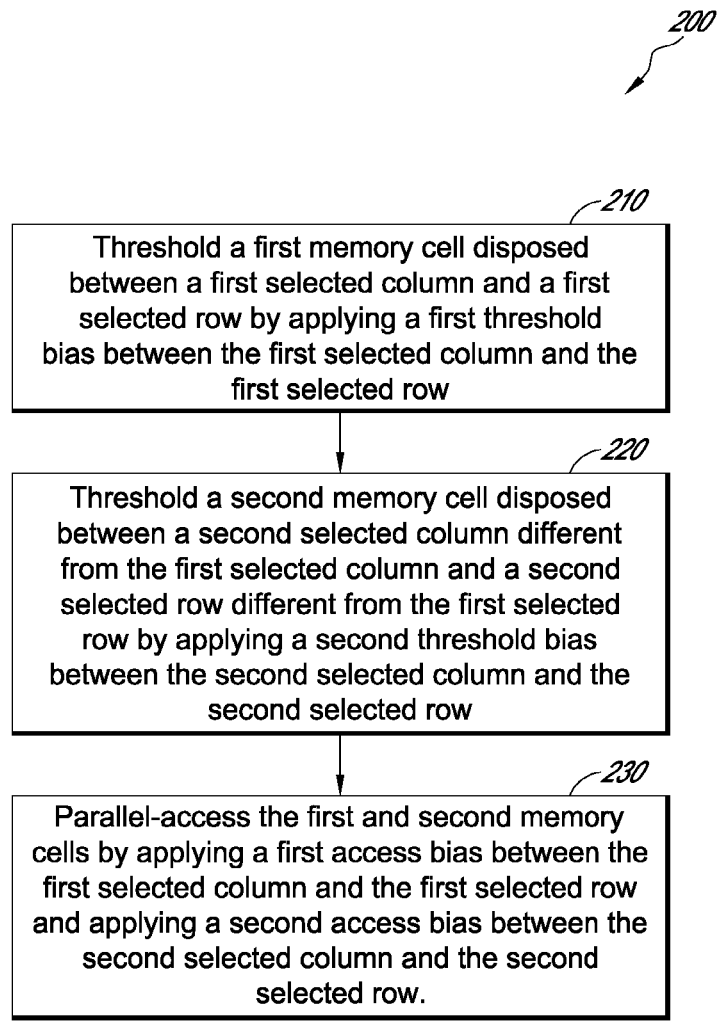
FIG. 6 is a flow chart depicting a method of accessing memory cells in a cross-point array according to one embodiment.

FIG. 6 is a block diagram 200 illustrating a method of accessing in parallel memory cells in a cross-point memory array according to one aspect. The method includes thresholding 210 a first target memory cell disposed between a first selected column and a first selected row by applying a first threshold bias between the first selected column and the first selected row. For example, the first bias can be a threshold target cell bias of the first target memory cell. The method additionally includes thresholding 220 a second target memory cell disposed between a second selected column different from the first selected column and a second selected row different from the first selected row by applying a second threshold bias between the second selected column and the second selected row. For example, the second bias can be a threshold target cell bias of the second target memory cell, which can be substantially similar to the threshold target cell bias of the first target memory cell. The method additionally includes accessing 230 the first and second target memory cells in parallel by applying a first access bias between the first selected column and the first selected row and applying a second access bias between the second selected column and the second selected row. For example, the first and second access biases can be a post-threshold SET access bias, a post-threshold RESET access bias, or a post-threshold READ access bias. The post-threshold access biases can be applied to first and second target memory cells while the target cells are in a thresholded condition (also referred to as a "hold" condition; see below "capture and hold" method discussion in connection with FIGS. 8A-8E), or under a reduced $V_{TH}$ condition after releasing the first and second target memory cells from a hold condition, e.g., within the recovery period after thresholding or after a refresh operation (see below "capture and release" method discussion in connection with FIGS. 7A-7E) as described in connection with FIG. 3, and therefore the magnitudes of the post-threshold access biases are substantially lower than the first and second threshold biases.

In another aspect, a memory device or a system comprising the memory array comprises a memory controller configured to access in parallel memory cells in a cross-point memory array according to one embodiment. The memory controller is configured to threshold a first target memory cell disposed between a first selected column and a first selected row by applying a first threshold bias between the first selected column and the first selected row. For example, the first threshold bias can be a threshold target cell bias of the first target memory cell. The memory controller is additionally configured to threshold a second target memory cell disposed between a second selected column different from the first selected column and a second selected row different from the first selected row by applying a second threshold bias between the second selected column and the second selected row. For example, the second threshold bias can be a threshold target cell bias of the second target memory cell, which can be substantially similar to the threshold target cell bias of the first target memory cell. The memory controller is additionally configured to access the first and second memory cells in parallel by applying a first access bias between the first selected column and the first selected row and applying a second access bias between the second selected column and the second selected row. For example, the first and second access biases can be a post-threshold SET access bias, a post-threshold RESET access bias, or a post-threshold READ access bias. The post-threshold access biases can be applied to first and second memory cells while the target cells are in a thresholded condition (also referred to as a "hold" condition; see below "capture and hold" discussion in connection with FIGS. 8A-8E), or under a reduced $V_{TH}$ condition after releasing the first and second target memory cells from a hold condition, e.g., within the recovery period after thresholding or after a refresh operation (see below "capture and release" discussion in connection with FIGS. 7A-7E), as described in connection with FIG. 3, and therefore the magnitudes of the post-threshold access biases are substantially lower than the first and second threshold biases. In one embodiment, the access biases are less than about one half of the first and second threshold biases in magnitude. In another embodiment, the access biases are less than about one third of the first and second threshold biases in magnitude. However, it will be appreciated that a particular value of the access bias may be chosen to be a convenient level that may already be available or desirable for the subsequent operation.

In some embodiments, in both "capture and hold" and "capture and release" methods, mixed access operations are possible. For example, the first access bias can be one of a post-threshold SET access bias, a post-threshold RESET access bias, and a post-threshold READ access bias, while the second access bias can be a different one of a post-threshold SET access bias, a post-threshold RESET access bias, and a post-threshold READ access bias.

Figure 7A:
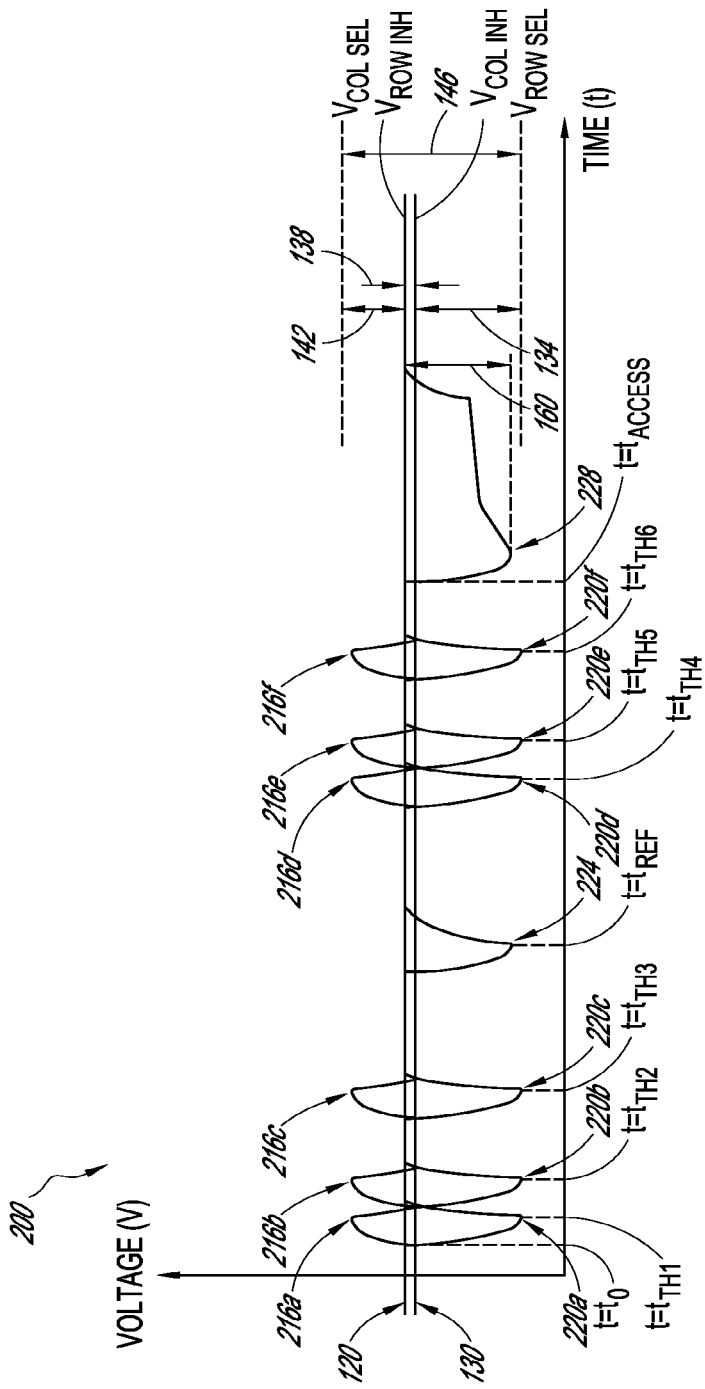
FIG. 7A is a graphical illustration of voltage versus time evolution for memory cells in a cross-point array being accessed in parallel according to one embodiment.

FIGS. 7A-7E represent a "capture and release" method of accessing memory cells in parallel in a cross-point memory array according to one embodiment, including "capturing" a suitable number of target memory cells by thresholding and "releasing" the target memory cells individually, followed by accessing (e.g., SET accessing) the target memory cells in parallel. FIG. 7A schematically illustrates a graph 200 schematically depicting voltage-time curves of columns and rows of a cross-point array as memory cells are accessed. The illustrated embodiment represents a SET access operation. However, in view of the disclosure herein it will be understood that the concepts described are generally applicable to a RESET access operation and a READ access operation. The y-axis and the x-axis of the graph 200 represent the voltage of the columns or rows and the corresponding time during the access operation, respectively. FIGS. 7B through 7E schematically illustrate various cell configurations in the cross-point memory array as the memory cells are accessed. For clarity, only four rows (266a-d, from top to bottom) and four columns (262a-d, from left to right) are depicted in the cross-point array, in which target cells T are represented as circles, A cells (i.e., inhibited cells along the selected column) are represented as squares, B cells (i.e., inhibited cells along the selected row) are represented as triangles, and C cells (i.e., all remaining inhibited cells across non-selected and inhibited rows and non-selected and inhibited columns) represented as X's.

Figure 7B:
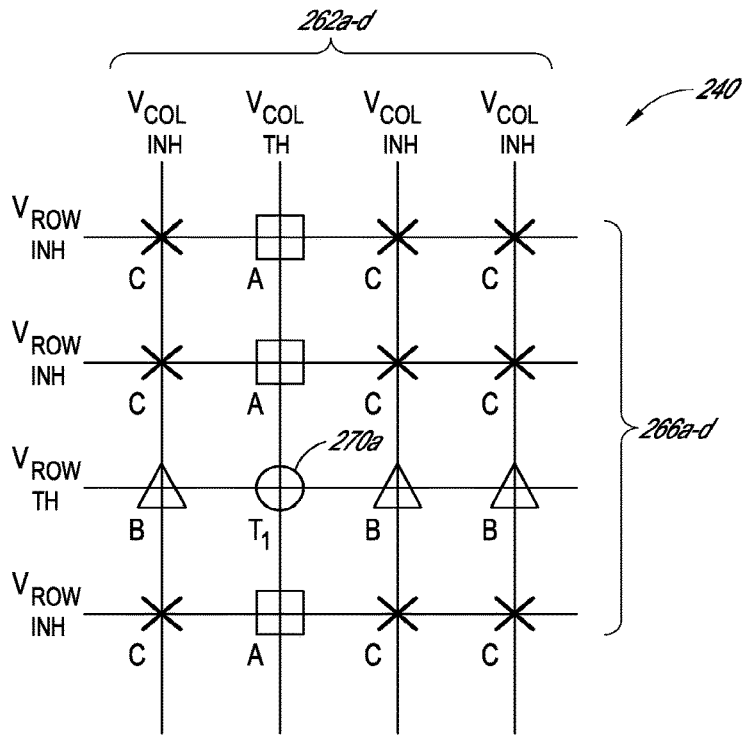
FIGS. 7B-7E are plan-views depicting memory cells in a cross-point memory array being accessed in parallel according one embodiment.

Referring to FIG. 7B, the "capture and release" method of accessing memory cells in parallel includes thresholding a first target memory ($T_1$) cell 270a by applying a first threshold target cell bias between the first selected column 262b and the first selected row 266c. The first bias is a $V_{TH}$ $_{SET}$ bias in the illustrated embodiment. Referring to FIG. 7A, thresholding the first target memory cell includes initially pre-charging all columns to a column inhibit voltage level $V_{COL\ INH}$ 130 and all rows to a row inhibit voltage level $V_{ROW\ INH}$ 120 That is, initially, all cells have a C cell bias, which can have a magnitude of ($V_{COL\ INH}-V_{ROW\ INH}$).

In one embodiment, $V_{COL\ INH}$ and $V_{ROW\ INHIBIT}$ can each have a value between about one fourth and three-fourths of $V_{TH\ SET}$, for instance about $V_{TH\ SET}/2$. In one embodiment, the C cell bias can be between about zero and 10% of $V_{TH\ SET}$.

The thresholding of the $T_1$ cell 270a additionally includes, at an initial time $t=t_0$, increasing the voltage level of the first selected column 262b to $V_{COL\ TH}$ and increasing (in absolute value of the magnitude) the voltage level of the first selected row 266c to $V_{ROW\ TH}$. Referring to FIG. 7A, increasing the voltage level up to a first thresholding event is represented by the rising edge of a first selected column voltage-time (V-T) curve 216a and the rising (in absolute value of the magnitude) edge of a first selected row voltage-time (V-T) curve 220a. The first thresholding event can occur at $t=t_{TH1}$ when the target cell 270a has been placed under a threshold target (T) cell bias 146 for a certain duration of time. In one embodiment, the T cell bias 146 can have a magnitude of $V_{COL\ TH}-V_{ROW\ TH}$). In one embodiment $t=t_{TH1}$ can occur when the first selected column voltage-time (V-T) curve 216a and the first selected row voltage-time (V-T) curve 220a reach their peaks.

Referring to FIG. 7B, thresholding the T1 cell 270a additionally includes inhibiting a plurality of first inhibited memory (A) cells between the selected column 262b and inhibited rows 266a, 266b, and 266d by applying a pre-threshold A cell bias 142 (similar to the A cell bias 142 in FIG. 4) between the first selected column 262b and inhibited rows 266a, 266b, and 266d. Additionally, thresholding the T1 cell 270a includes inhibiting a plurality of second inhibited memory (B) cells between the selected row 266c and inhibited columns 262a, 262c, and 262d by applying a pre-threshold B cell bias 134 (similar to the B cell bias 134 in FIG. 4) between the first selected row 266c and inhibited columns 262a, 262c, and 262d. Similar to FIG. 4, in order to provide the pre-threshold A cell bias 142 across A cells and to maintain the pre-threshold B cell bias 134 across B cells, the voltage levels of inhibited columns 262a, 262c, and 262d and the voltage levels of inhibited rows 266a, 266b, and 266d are maintained at $V_{COL\ INH}$ and $V_{ROW\ INH}$, respectively. As a result, similar to FIG. 4, the T cell bias 146 is applied across the target cell 270a.

Still referring to FIG. 7B, thresholding the $T_1$ cell 270a additionally includes inhibiting a plurality of third inhibited memory (C) cells between the inhibited columns 262a, 262c, and 262d and inhibited rows 266a, 266b, and 266d by applying a pre-threshold C cell bias 138 (similar to the C cell bias 138 in FIG. 4) between the inhibited columns 262a, 262c, and 262d and inhibited rows 266a, 266b, and 266d. Similar to FIG. 4, the pre-threshold C cell bias 138 can be provided across a plurality of third inhibited C memory cells along the inhibited columns 262a, 262c, and 262d and inhibited rows 266a, 266b, and 266d by providing $V_{ox\ INH}$ and $V_{ROW\ INH}$ to the inhibited columns and to inhibited rows, respectively.

Adjusting magnitudes of the first inhibit bias (the pre-threshold A cell bias 142) and the second inhibit bias (the pre-threshold B cell bias 134) can be important in minimizing the overall leakage current, and therefore the power consumption, of the cross-point array. In some embodiments, the magnitude of the first inhibit bias is substantially similar in magnitude to the second inhibit bias, as may be the case when the voltage levels $V_{COL\ INH}$ and $V_{ROW\ INH}$ have similar values. In these embodiments, the third inhibit bias (the pre-threshold C cell bias 138), whose magnitude can be represented by ($V_{COL\ INH}-V_{ROW\ INH}$), can be relatively low, for example between about zero and 10% of $V_{TH\ RESET}$. Other embodiments are possible, where the magnitude of the first inhibit bias (the pre-threshold A cell bias 142) is substantially different in magnitude compared to the second inhibit bias (the pre-threshold B cell bias 134). In these embodiments, the third inhibit bias (the pre-threshold C cell bias 138) can be between about 10% and 30% of $V_{TH\ RESET}$.

Figure 7C:
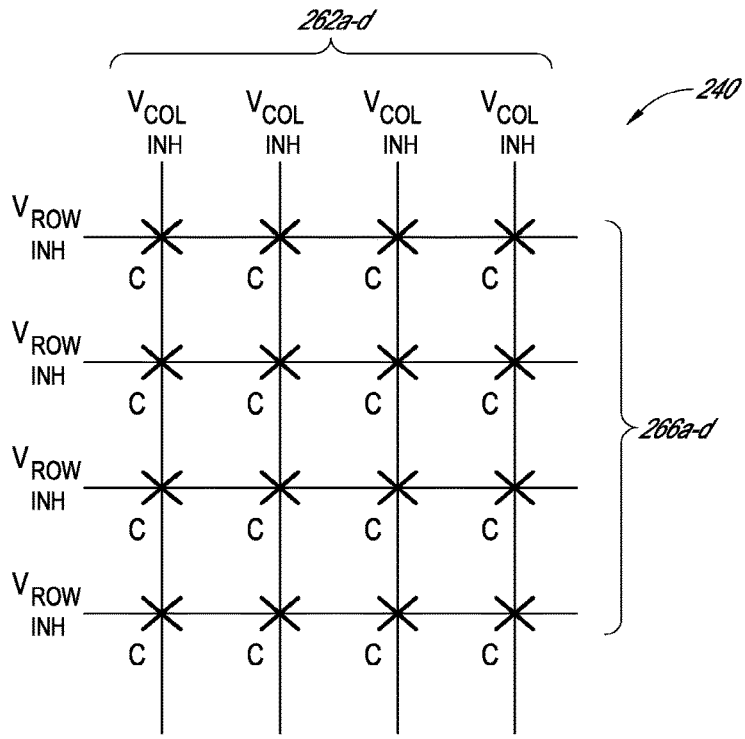

Once the first thresholding event has occurred at $t=t_{TH1}$ as described above, the "capture and release" method of accessing memory cells in parallel further includes returning the selected column 262b and the selected row 266c to $V_{COL\ INH}$ and $V_{ROW\ INH}$, respectively, as illustrated in FIG. 7A by the falling (in absolute value of the magnitude) edges of the first selected column and the first selected row V-T curves 216a and 220a. By this process, all cells return to having the C cell bias 138. This state is shown in FIG. 7C. In the illustrated embodiment, the bias across the $T_1$ cell can fall below $V_H$, thereby "releasing" (i.e., terminating) the thresholded state of the $T_1$ cell. As discussed above, $T_1$ cell at this state has a $V_{TH}$ lower than its initial $V_{TH}$ prior to being thresholded.

Figure 7D:
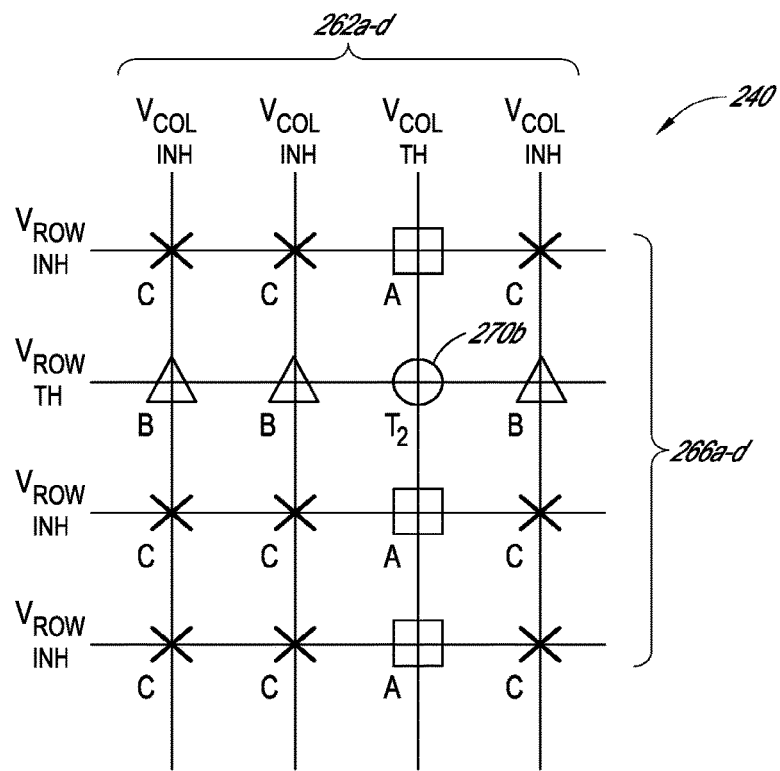

Now referring to FIG. 7D, the "capture and release" method of accessing memory cells in parallel, according to the illustrated implementation, includes thresholding a second target memory ($T_2$) cell 270b by applying a second threshold target cell bias between a second selected column 262c and a second selected row 266b. The operations included in thresholding the $T_2$ cell 270b are similar to the operations described above for thresholding the $T_1$ cell 270a, and can be described in reference to a second selected column voltage-time (V-T) curve 216b and a second selected row voltage-time (V-T) curve 220b in FIG. 7A. The $T_2$ cell 270b is selected from one of third inhibited memory (C) cells at the time the $T_1$ cell 270a was selected for thresholding (i.e., a memory cell disposed between one of previously inhibited columns 262a, 262c, and 262d, and one of previously inhibited rows 266a, 266b, and 266d). At time $t=t_{TH2}$, the voltage levels of the second selected column 262c is increased to $V_{COL\ SEL}$ and the voltage level of the second selected row 266b is increased (in absolute value of the magnitude) to $V_{ROW\ SEL}$. Similar to thresholding the $T_1$ cell 270a, thresholding the $T_2$ cell 270b can occur at $t=t_{TH2}$ after the $T_2$ 270b has been placed under a T cell bias 146 for a certain duration of time.

In addition, similar to thresholding the $T_1$ cell 270a, thresholding the $T_2$ cell 270b includes inhibiting a plurality of first inhibited memory (A) cells between the second selected column 262c and inhibited rows 266a, 266c, and 266d by applying a pre-threshold A cell bias 142 between the second selected column 262c and a plurality of inhibited rows 266a, 266c, and 266d. Additionally, thresholding the $T_2$ cell 270b includes inhibiting a plurality of second inhibited memory (B) cells between the second selected row 266b and inhibited columns 262a, 262b, and 262d by applying a pre-threshold B cell bias 134 between the second selected row 266b and a plurality of inhibited columns 262a, 262b, and 262d. Additionally, thresholding the $T_2$ cell includes inhibiting a plurality of third inhibited memory (C) cells between inhibited columns 262a, 262b, and 262d and inhibited rows 266a, 266c, and 266d by applying a pre-threshold C cell bias 138 between the inhibited columns 262a, 262b, and 262d and inhibited rows 266a, 266c, and 266d.

After thresholding the $T_2$ cell 270b at $t=t_{TH2}$ as described above, the "capture and release" method of accessing memory cells in parallel further includes returning the second selected column 262c to the column inhibit voltage level $V_{COL\_INH}$ as illustrated in FIG. 7A by the falling edge of the second selected column voltage-time (V-T) curve 216b, and returning the selected row 266b to the row inhibit voltage level $V_{ROW\_INH}$ as illustrated in FIG. 7A by the falling (in absolute value of the magnitude) edge of the selected row voltage-time (V-T) curve 220b. At this point, all cells are returned to having a C cell bias as illustrated in the cross-point array 240 in FIG. 7C. The $T_2$ cell 270b is "released" by terminating the thresholded state of the $T_2$ cell 270b by allowing the bias across the $T_2$ cell 270b to fall below $V_H$. Upon "release," as discussed above, the $T_2$ cell 270b has a $V_{TH}$ lower than its initial $V_{TH}$ prior to being thresholded.

In some embodiments, the method of accessing memory cells in parallel can include "capturing" a suitable number of additional target memory cells by thresholding and "releasing" the additional target memory cells. Referring to FIG. 7A, by way of an example only, third through sixth target memory cells $T_3$-$T_6$ disposed between third through sixth selected columns and third through sixth selected rows can be "captured" by thresholding through application of third through sixth biases (the T cell bias 146) and "released" by terminating the thresholded states. Additional "capturing and releasing" of the $T_3$-$T_6$ cell is represented by selected column voltage-time (V-T) curves 216c-216f and selected row voltage-time (V-T) curves 220c-220f. The third through sixth thresholding events can occur at $t=t_{TH3}$, $t=t_{TH4}$, $t=t_{TH5}$, and $t=t_{TH6}$, respectively.

In one embodiment, the "capture and release" method of accessing memory cells in parallel additionally includes refreshing the thresholded target cells to maintain the lowered $V_{TH}$ values. As discussed above, upon "releasing," the thresholded target cells initially have $V_{TH}$ values lower than their original $V_{TH}$ values prior to being thresholded, and the $V_{TH}$ values gradually "recover" their original $V_{TH}$ values. Therefore, in some embodiments, the lowered $V_{TH}$ values can be maintained by "refreshing" the thresholded target cells by application of a refresh bias on previously selected rows at $t=t_{REF}$, as illustrated by a selected voltage-time (V-T) curve 224 in FIG. 7A.

The "capture and release" method of accessing memory cells in parallel additionally includes accessing a plurality of memory cells that have been thresholded by applying an access bias 160 between columns and rows selected during thresholding the plurality of memory cells. An access operation can be a SET access operation including an amorphous-to-crystalline transition of the storage element, a RESET access operation including a crystalline-to-amorphous transition of the storage element, or a READ access operation that does not include a phase transition. For illustrative purposes only, a SET access operation is illustrated by a selected row voltage-time (V-T) curve 228 in FIG. 7A. By way of an example only in FIG. 7E, the plurality of memory cells to be accessed include the $T_1$ cell 270a and the $T_2$ cell 270b. These two target cells 270a, 270b do not share access lines, that is, are on adjacent row and column lines, such that they can be considered "diagonally" removed from one another. Because the two target cells 270a and 270b do not share access lines, the $T_1$ cell 270a "sees" a C cell bias when $T_2$ cell 270b is being selected, and vice versa. This approach minimizes the impact of the previously selected cells when the subsequent cells are being accessed. In this embodiment, accessing can be initiated within a suitable delay time, e.g., within the recovery period of the first threshold event or within the recovery period after a refresh event, such that $T_1$ and $T_2$ cells 270a and 270b continue to have a suitably lowered $V_{TH}$ due to having been previously thresholded. In some embodiments, the delay time can be between about 10 nanoseconds and 1 microsecond. In other embodiments, the delay time can be between about 50 nanoseconds and 500 nanoseconds. In addition, the suitably lowered $V_{TH}$ can be a $V_{TH}$ value less than a A or B cell biases, for example.

Figure 7E:
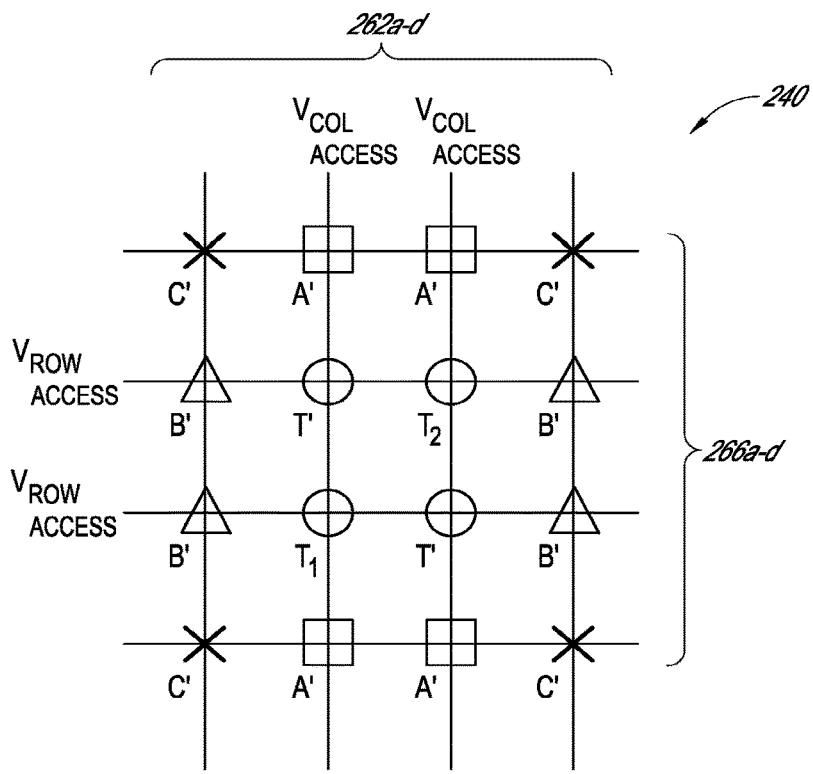

As illustrated in FIGS. 7A and 7E, SET-accessing the plurality of memory cells 270a and 270b include, at $t=t_{ACCESS}$, increasing the voltage levels of the first and second selected rows 266c and 266b to $V_{ROW\_ACCESS}$. Referring to FIG. 7A, increasing the voltage levels is represented by the rising (in absolute value of the magnitude) edge of selected rows voltage-time (V-T) curve 228. In some embodiments SET-accessing the plurality of memory cells 270a and 270b can additionally include increasing the voltage levels of the first and second selected columns 262b and 262c to $V_{COL\_ACCESS}$ (not shown).

In some embodiments, SET-accessing the plurality of memory cells 270a and 270b can additionally include inhibiting non-target cells. For example, in FIG. 7E, at $t=t_{ACCESS}$, a plurality of first inhibited memory (A') cells, a plurality of second inhibited memory (B'), and a plurality of third inhibited memory cells (C') can be inhibited by providing a suitable post-threshold A' cell bias between selected columns and unselected rows; providing a suitable post-threshold B' cell bias between selected rows and unselected columns; and providing a suitable C' cell bias between unselected rows and unselected columns. Inhibiting A', B' and C' cells in SET-accessing are similar to inhibiting A, B, and C cells in thresholding A, B, and C cells, except that the inhibit voltages applied to inhibited columns and rows are proportionally lower compared to the lowered $V_{TH}$ value as a result of thresholding the target cells. In addition, accessing target cells 270a and 270b by providing an access bias to the target cells can result in the same access bias resulting across non-target cells T' adjacent the target cells 270a and 270b. While T' cell receive the same bias compared to $T_1$ and $T_2$ cells, however, unintended SET-accessing of T' cells can be avoided because T' cells have higher $V_{TH}$ compared to thresholded $T_1$ and $T_2$ cells. That is, while the cell access bias 160 is substantially smaller in magnitude compared to the threshold T cell bias 146, $T_1$ and $T_2$ cells can be SET-accessed because the threshold voltages have been reduced in the wake of the snap back thresholding phenomenon. On the other hand, the same cell access bias 160 is not sufficient to threshold non-target T' cells.

FIGS. 8A-8E represent a "capture and hold" method of accessing memory cells in parallel in a cross-point memory array according to another embodiment, including "capturing" a suitable number of target memory cells by thresholding and "holding" the target memory cells until they are accessed (e.g., SET accessed). The graph 300 schematically depicts voltage-time curves of columns and rows of a cross-point array as memory cells are accessed in parallel. Similar to FIGS. 7A-7E, while the illustrated embodiment represents a SET access operation, in view of the disclosure herein it will be understood that the concepts described are generally applicable to a RESET access operation as well as a READ access operation. The y-axis represents the voltage of the columns or rows, and the x-axis represents time.

FIGS. 8B through 8E schematically illustrate various cell configurations of a cross-point memory array comprising memory cells being accessed. For clarity, only four rows (366a-d, from top to bottom) and four columns (362a-d, from left to right) are depicted in the cross-point array, in which target cells T are represented as circles, A cells (i.e., inhibited cells along the selected column) are represented as squares, B cells (i.e., inhibited cells along the selected row) are represented as triangles, and C cells (i.e., all remaining inhibited cells across non-selected and inhibited rows and non-selected and inhibited columns) represented as X's.

Figure 8A:
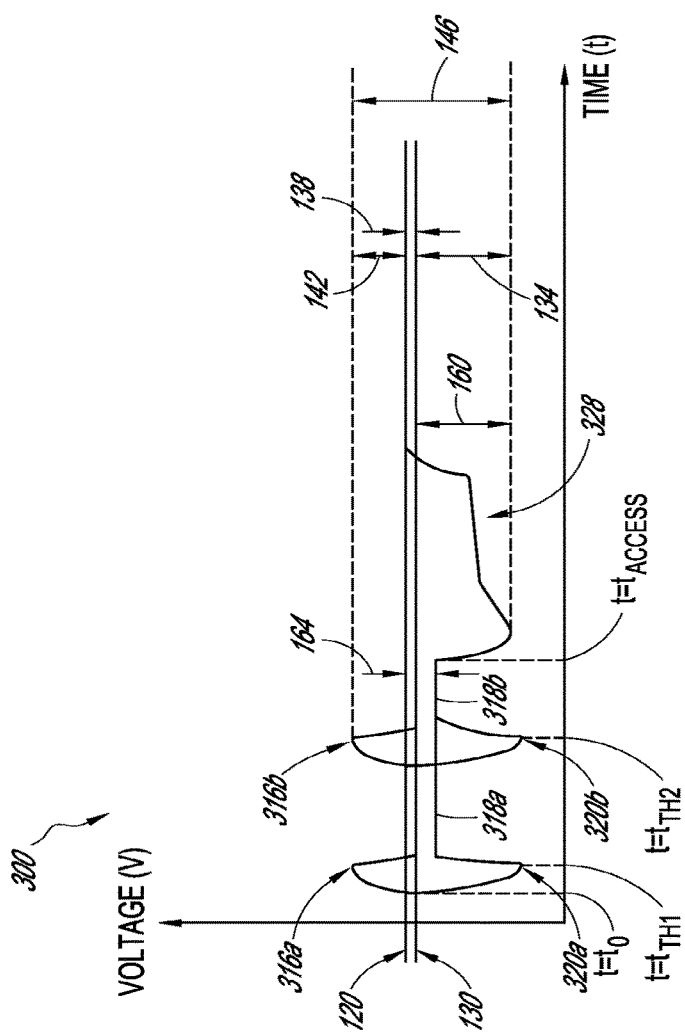
FIG. 8A is a graphical illustration of voltage versus time evolution for memory cells in a cross-point array being accessed in parallel according to one embodiment.
Figure 8B:
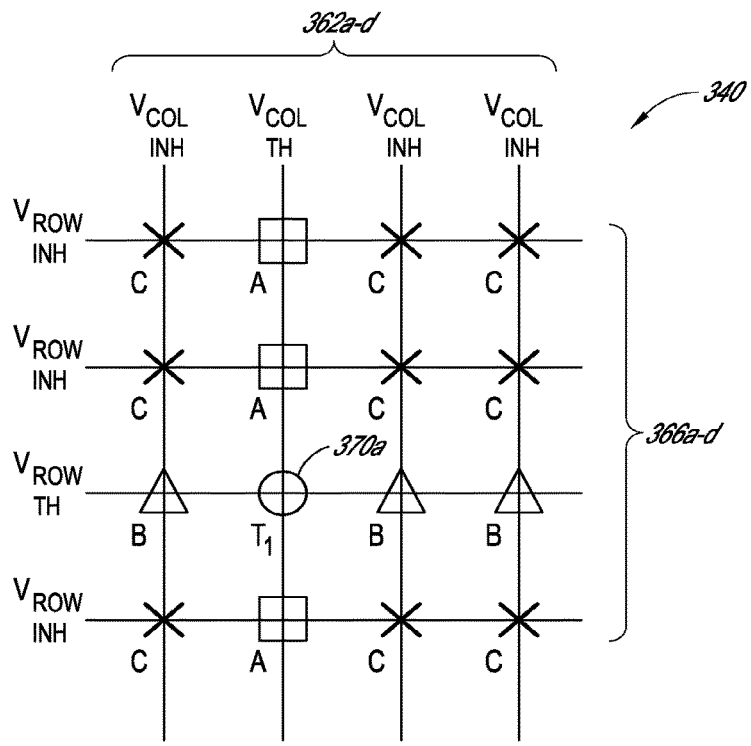
FIGS. 8B-8E are plan-views depicting memory cells in a cross-point memory array being accessed in parallel according one embodiment.
Figure 8C:
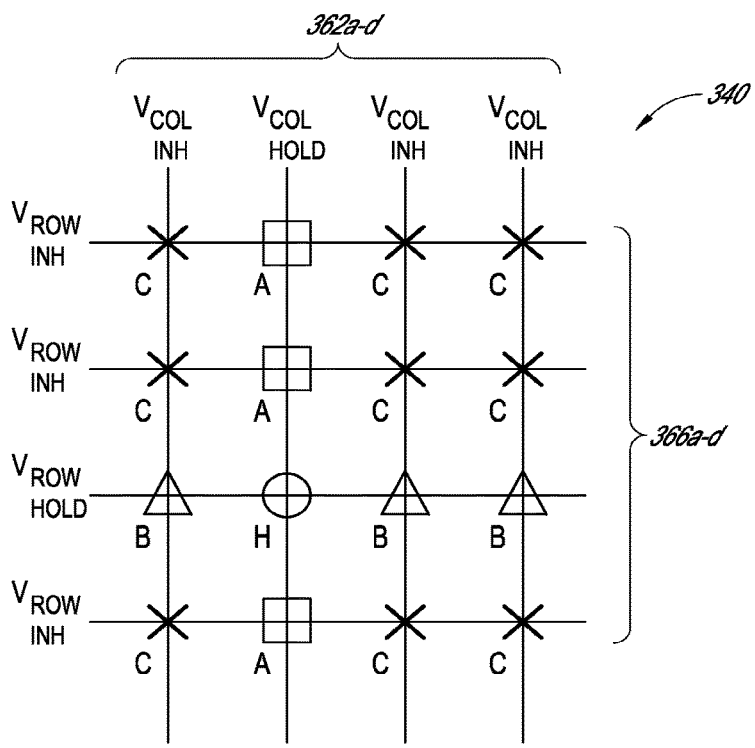

Referring to FIG. 8B, the "capture and hold" method of accessing memory cells in parallel includes thresholding a first target memory ($T_1$) cell 370a by applying a first threshold bias 146 between the first selected column 362b and the first selected row 366c. The V-T relationship of thresholding the $T_1$ cell 370a is represented in FIG. 8A by a column voltage-time (V-T) curve 316a and a row voltage-time (V-T) curve 320a. Operations involved in thresholding the $T_1$ cell 370a is substantially similar to that described in connection with thresholding the $T_1$ cell 270a in connection with FIG. 7B. Similarly, thresholding the $T_1$ cell 370a includes inhibiting a plurality of first inhibited memory cells (A), a plurality of second inhibited memory cells (B), and a plurality of third inhibited memory cells (C) as described similarly in connection with FIG. 7B. Also similar to FIG. 7B, the first thresholding event occurs at $t=t_{TH1}$.

In contrast to FIG. 7C, however, after thresholding, the "capture and hold" method of accessing memory cells in parallel does not include "releasing" the memory cells, i.e., does not include returning both the selected column 362b to $V_{COL\ INH}$ 130 and returning the selected row 366c to $V_{ROW\ INH}$ 120 as illustrated in FIG. 8A, according to one embodiment. Instead, the voltage on the selected row 366c is reduced (in absolute value of the magnitude) to a row hold voltage level $V_{ROW\ HOLD}$ as represented by a row voltage-time (V-T) curve 318a. In addition, the voltage on the selected column 362b can be returned to a column inhibit voltage level ($V_{COL\ INH}$) 130. Alternatively, the voltage on the selected column 362b can be reduced to a column hold voltage level $V_{COL\ HOLD}$ (not shown). The resulting bias across the $T_1$ cell 370a is a post-threshold target cell hold bias 164. As discussed above in connection with FIG. 4, the post-threshold target cell hold bias 164 is sufficient to maintain the thresholded state of $T_1$ cell 370a.

Figure 8D:
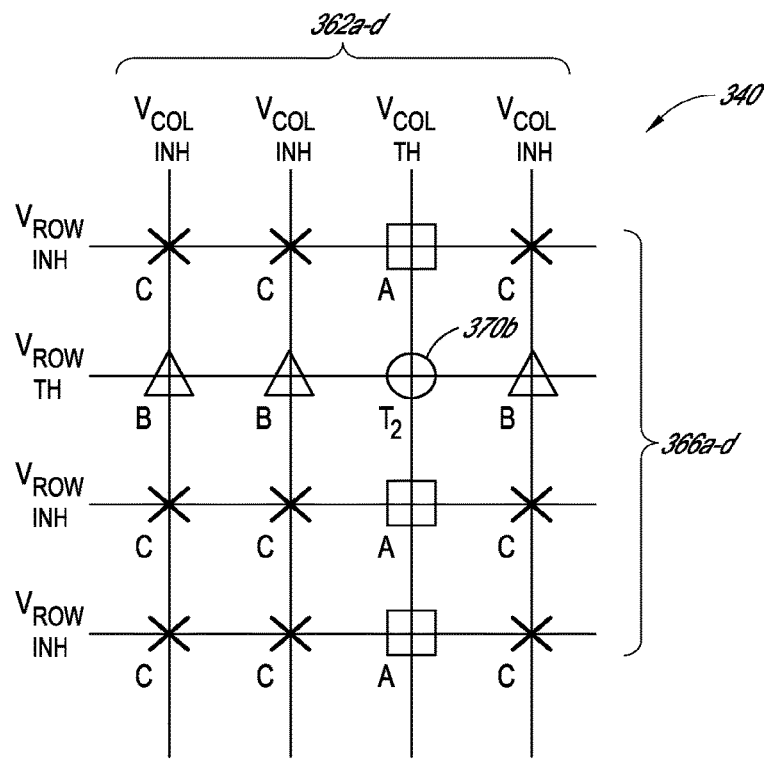

Referring to FIG. 8D, the method of parallel-accessing a chalcogenide-based cross-point memory array includes thresholding a second target memory ($T_2$) cell by applying a second target cell threshold bias 146 between the second selected column 362c and the second selected row 366b. The thresholding of $T_2$ cell 370b is represented in FIG. 8A by a column voltage-time (V-T) curve 316b and a row voltage-time (V-T) curve 320b. The operations included in thresholding the $T_2$ cell 370b are substantially similar to the operations described above for thresholding the $T_2$ cell 270b in connection with FIG. 7D. Similar to FIG. 7D, The $T_2$ cell 370b is selected from one of third inhibited memory (C) cells at the time the $T_1$ cell 370a was selected for thresholding (i.e., a memory cell disposed between one of previously inhibited columns 362a, 362c, and 362d, and one of previously inhibited rows 366a, 366b, and 366d).

Once the $T_2$ cell 370b has been thresholded as described above, the "capture and hold" method of accessing memory cells in parallel includes reducing (in absolute value of the magnitude) the voltage on the second selected row 366b to a row hold voltage level $V_{ROW\ HOLD}$ as represented by a row voltage-time (V-T) curve 318b. In addition, the voltage on the selected column 362c can be returned to a column inhibit voltage level ($V_{COL\ INH}$) 130. Alternatively, the voltage on the second selected column 362c can be reduced to a column hold voltage level $V_{COL\ HOLD}$ (not shown). The resulting bias across the $T_2$ cell 370b is a post-threshold target cell hold bias 164. As discussed above in connection with FIG. 4, the post-threshold target cell hold bias 164 is sufficient to maintain the thresholded state of $T_2$ cell 370b.

In addition, in some embodiments, the "capture and hold" method of accessing memory cells in parallel can include thresholding a suitable number of additional target cells. For example, third through Nth target memory cells $T_3$-$T_N$ (not shown) can be "captured" by thresholding and "held" by applying post-threshold target cell hold bias 164.

Similar to the "capture and release" method, the "capture and hold" method of accessing memory cells in parallel additionally includes accessing a plurality of memory cells that have been thresholded and held by applying an access bias 160 between columns and rows selected during thresholding the plurality of memory cells. An access operation can be a SET access operation including an amorphous-to-crystalline transition of the storage element, a RESET access operation including a crystalline-to-amorphous transition of the storage element, or a READ access operation that does not include a phase transition. For illustrative purposes only, a SET access operation is illustrated by a selected row voltage-time (V-T) curve 328 in FIG. 8A. By way of an example only in FIG. 8E, the plurality of memory cells to be accessed include the $T_1$ cell 370a and the $T_2$ cell 370b.

Figure 8E:
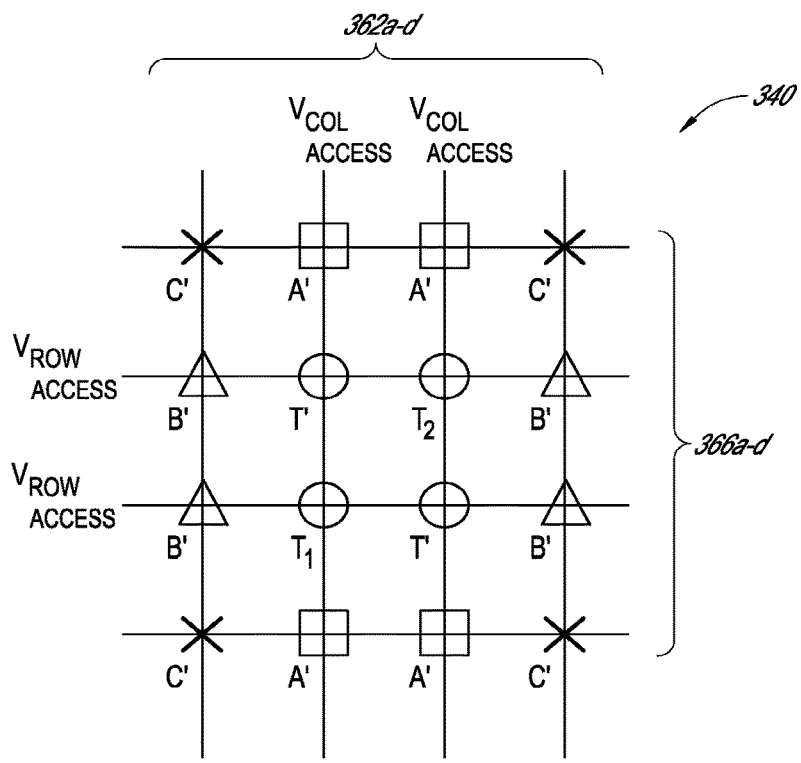

As illustrated in FIGS. 8A and 8E, SET-accessing the plurality of target memory cells 370a and 370b include, at $t=t_{ACCESS}$, increasing (in absolute value of the magnitude) the voltage levels of the first and second selected rows 366c and 366b to $V_{ROW\ ACCESS}$. Referring to FIG. 8A, increasing (in absolute value of the magnitude) the voltage levels is represented by the rising (in absolute value of the magnitude) edge of selected rows voltage-time (V-T) curve 328. In some embodiments, SET-accessing the plurality of memory cells 370a and 370b can additionally include maintaining the voltage levels of the first and second selected columns 362b and 362c to at ($V_{COL\ INH}$) 130. Alternatively, the voltage levels of the first and second selected columns 362b and 362c can be increased to $V_{COL\ ACCESS}$ (not shown).

In some embodiments, SET-accessing the plurality of memory cells 370a and 370b can additionally include inhibiting non-target cells in a similar manner to that discussed with reference to FIG. 7E. For example, in FIG. 8E, at $t=t_{ACCESS}$, a plurality of first inhibited memory (A') cells, a plurality of second inhibited memory (B'), and a plurality of third inhibited memory cells (C') can be inhibited by providing a suitable post-threshold A' cell bias between selected columns and unselected rows, providing a suitable post-threshold B' cell bias between selected rows and unselected columns, and providing a suitable C' cell bias between unselected rows and unselected columns.

Thus, as described herein, the snap-back thresholding event immediately reduces the bias across a target memory cell. This behavior can be utilized in the "capture and hold" method to access multiple cells in parallel by thresholding (i.e., "capturing") multiple cells sequentially and subsequently holding the multiple cells under a hold condition at a $V_H$ that is substantially less than Vth (for example, between about 10% and 50% in magnitude). The multiple held cells are then are accessed simultaneously at an access voltage lower than the threshold voltage.

Also as described herein, once a cell has been snap-back thresholded and "released," the $V_{TH}$ of the "released" memory cell can take time to recover. This behavior can be utilized in the "capture and release" method to access multiple cells in parallel by thresholding (i.e., "capturing") multiple cells sequentially and subsequently accessing multiple cells in parallel at an access voltage lower than threshold voltages within the recovery period of the first thresholding event, or within the recovery period following a refresh event.

In addition, because the non-thresholded cells retain their high $V_{TH}$ between thresholding and accessing target cells, and the access voltages of thresholded cells are substantially lower than the $V_{TH}$ of non-thresholded cells, the chances of unintentionally thresholding non-thresholded cells are minimized. The above-described approaches of accessing multiple cells in parallel after sequentially thresholding can be particularly beneficial in a SET access operation, which can take longer (e.g., hundreds of nanoseconds to microseconds) than other access operations due to longer access bias portion (e.g., a RESET access operation involving an amorphous to crystalline transition) in phase change memory technology. By thresholding multiple cells, which can be much faster (e.g., few to tens of nanoseconds) than full access operations, followed by SET-accessing the multiple cells simultaneously, a higher SET bandwidth can be achieved.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method, comprising:
   accessing a first memory cell of an array of memory cells coupled with a first selected column and a first selected row based at least in part on applying a first access pulse;
   applying, during a first threshold duration, a first threshold pulse between the first selected column and the first selected row, wherein the first memory cell is accessed during the first threshold duration;
   pre-charging the first memory cell by applying a first inhibit pulse between the first selected column and the first selected row before applying the first threshold pulse;
   accessing, in parallel with accessing the first memory cell, a second memory cell of the array of memory cells coupled with a second selected column and a second selected row based at least in part on applying a second access pulse;
   applying, during a second threshold duration, a second threshold pulse between the second selected column and the second selected row, wherein the second memory cell is accessed during the second threshold duration; and
   pre-charging the second memory cell by applying a second inhibit pulse between the second selected column and the second selected row before applying the second threshold pulse, wherein a magnitude of the first inhibit pulse is different than a magnitude of the second inhibit pulse.

2. The method of claim 1, wherein a magnitude of at least one of the first access pulse or the second access pulse is lower than a magnitude of least one of the first threshold pulse or the second threshold pulse.

3. The method of claim 1, further comprising:
   applying, after the first threshold duration and based at least in part on applying the first threshold pulse, an additional threshold pulse to the first memory cell, the additional threshold pulse having a lower magnitude than the first threshold pulse.

4. A method, comprising:
   accessing a first memory cell coupled with a first selected column and a first selected row based at least in part on applying a first access pulse;
   accessing, in parallel with accessing the first memory cell, a second memory cell coupled with a second selected column and a second selected row based at least in part on applying a second access pulse;
   applying, during a first threshold duration, a first threshold pulse between the first selected column and the first selected row, wherein the first memory cell is accessed during the first threshold duration;
   applying, during a second threshold duration, a second threshold pulse between the second selected column and the second selected row, wherein the second memory cell is accessed during the second threshold duration;
   applying, after the first threshold duration and based at least in part on applying the first threshold pulse, an additional threshold pulse to the first memory cell, the additional threshold pulse having a lower magnitude than the first threshold pulse;
   releasing the first memory cell from a hold condition based at least in part on removing the additional threshold pulse applied to the first memory cell; and
   refreshing the first memory cell by applying a refresh pulse to the first memory cell after releasing the first memory cell from the hold condition.

5. The method of claim 4, further comprising:
   applying a second hold voltage to the second memory cell during the second threshold duration based at least in part on applying the second threshold pulse; and
   releasing the second memory cell from the hold condition based at least in part on removing the second hold voltage applied to the second memory cell.

6. The method of claim 1, wherein accessing the first memory cell comprises applying the first access pulse between the first selected column and the first selected row and accessing the second memory cell comprises applying the second access pulse between the second selected column and the second selected row.

7. The method of claim 1, wherein the first memory cell and the second memory cell are accessed concurrently.

8. The method of claim 7, wherein the first memory cell and the second memory cell are accessed simultaneously.

9. The method of claim 1, further comprising:
   adjusting a current flowing across the first memory cell and the second memory cell based at least in part on removing the first threshold pulse during the first threshold duration and removing the second threshold pulse during the second threshold duration.

10. The method of claim 1, wherein the first memory cell and the second memory cell are disposed within a cross-point memory array, and the first memory cell, or the second memory cell, or both comprise a chalcogenide material.

11. The method of claim 1, further comprising:
    inhibiting a plurality of memory cells of a memory array based at least in part on applying the first inhibit pulse to each of the plurality of memory cells.

12. The method of claim 4, further comprising:
inhibiting a plurality of memory cells of a memory array based at least in part on applying a first inhibit pulse to each of the plurality of memory cells.

13. The method of claim 4, wherein a magnitude of at least one of the first access pulse or the second access pulse is lower than a magnitude of least one of the first threshold pulse or the second threshold pulse.

14. The method of claim 4, wherein the first memory cell and the second memory cell are accessed concurrently.

15. The method of claim 4, wherein the first memory cell and the second memory cell are accessed simultaneously.

16. The method of claim 4, wherein the first memory cell and the second memory cell are disposed within a cross-point memory array, and the first memory cell, or the second memory cell, or both comprise a chalcogenide material.

* * * * *